(12) United States Patent
Hiyama

(10) Patent No.: US 7,710,187 B2
(45) Date of Patent: May 4, 2010

(54) GATE DRIVE CIRCUIT

(75) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 27 days.

(21) Appl. No.: 12/027,616

(22) Filed: Feb. 7, 2008

(65) Prior Publication Data

US 2009/0066402 A1    Mar. 12, 2009

(30) Foreign Application Priority Data

Sep. 12, 2007    (JP) .............................. 2007-236671

(51) Int. Cl.
*H03K 17/04* (2006.01)
(52) U.S. Cl. ..................... 327/374; 327/108; 327/427; 327/434; 326/21; 326/82
(58) Field of Classification Search ......... 327/108–112, 327/170, 374–377, 379–384, 427, 434; 326/21–24, 326/82–84, 89
See application file for complete search history.

(56) References Cited

U.S. PATENT DOCUMENTS 4,910,416 A * 3/1990 Salcone ...................... 327/374

6,333,665 B1 * 12/2001 Ichikawa .................... 327/434

FOREIGN PATENT DOCUMENTS

| JP | 4-29558 | 1/1992 |
|---|---|---|
| JP | 2000-232347 | 8/2000 |
| JP | 2000-253646 | 9/2000 |
| JP | 2000253646 A * | 9/2000 |
| JP | 2001-37207 | 2/2001 |
| JP | 2003-189593 | 7/2003 |
| JP | 2003-319638 | 11/2003 |

* cited by examiner

*Primary Examiner*—Long Nguyen
*Assistant Examiner*—Shikha Goyal
(74) *Attorney, Agent, or Firm*—Oblon, Spivak, McClelland, Maier & Neustadt, L.L.P.

(57) ABSTRACT

A gate drive circuit includes a turn-on side circuit for turning on a gate of a power switching device, the turn-on side circuit including a first turn-on side power supply circuit and a second turn-on side power supply circuit, the first turn-on side power supply circuit including: a first turn-on voltage source for supplying a first turn-on voltage; first turn-on wiring; and a first turn-on switch connected in the first turn-on wiring and controlled by a gate drive signal; and the second turn-on side power supply circuit including: a second turn-on voltage source for supplying a second turn-on voltage applied to the gate of the power switching device to set the power switching device in a steady (on) state; second turn-on wiring; a second turn-on switch connected in the second turn-on wiring; and a turn-on side delay circuit for delaying the gate drive signal and passing it to the second turn-on switch.

5 Claims, 14 Drawing Sheets

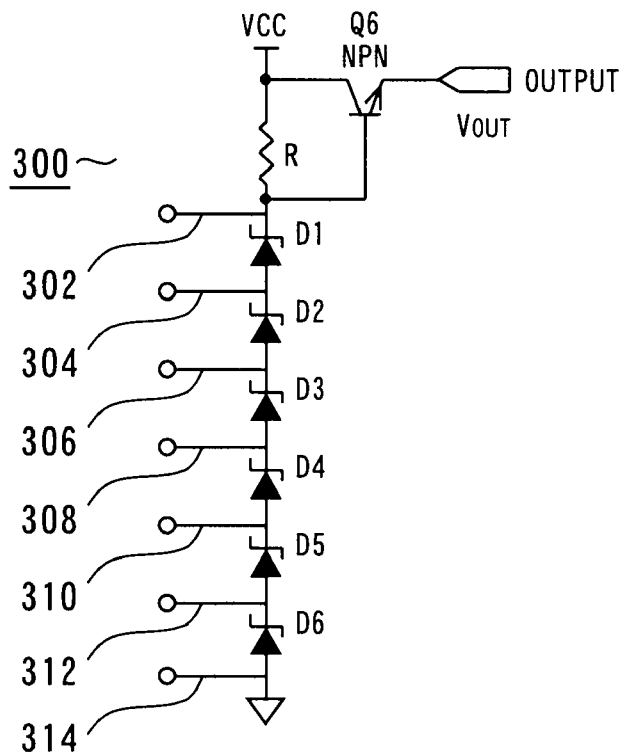
F I G. 16
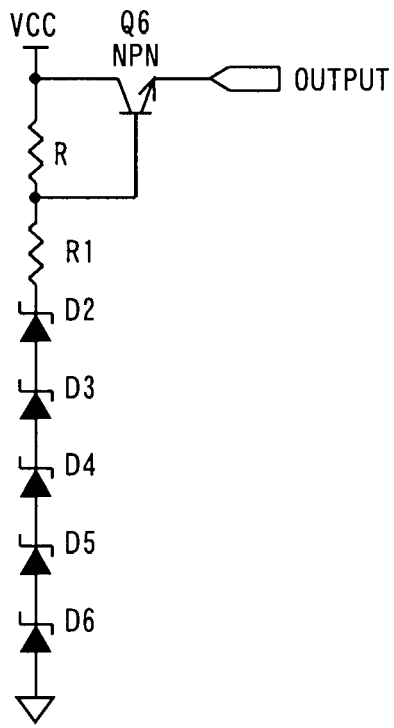
F I G. 17

| No. | VD | tc(on) [ns] | tr [ns] | Irr [A] |
|---|---|---|---|---|
| 1 | 11.5 | 232 | 124 | 44 |
| 3 | 12.5 | 224 | 112 | 48 |
| 4 | 13.5 | 160 | 92 | 56 |
F I G. 18
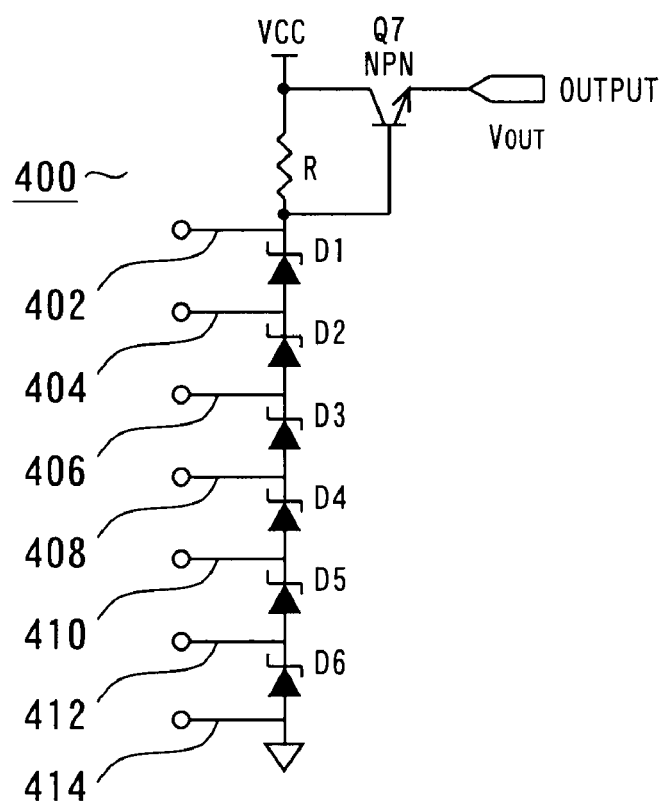
F I G. 19

GATE DRIVE CIRCUIT

BACKGROUND OF THE INVENTION

1. Field of the Invention

The present invention relates to gate drive circuits adapted to improve the switching characteristics of devices and more particularly adapted to improve the switching characteristics of power switching devices.

2. Background Art

A bridge circuit such as an inverter generally includes a plurality of power semiconductor devices. Examples of power semiconductor devices which are widely used in bridge circuits include voltage driven power semiconductor devices such as IGBTs (Insulated Gate Bipolar Transistors) and MOSFETs. A circuit for controlling the gate voltage of a voltage driven power semiconductor device is commonly referred to as a "gate drive circuit." That is, a gate drive circuit is used to cause a power semiconductor device to perform a switching operation.

JP-A-2001-37207 discloses an exemplary gate drive circuit for driving a power semiconductor device, which includes a turn-on side circuit for turning on the gate of the power semiconductor device, a turn-off side circuit for turning off the gate, and delay circuits. This gate drive circuit turns on the power semiconductor device in the following manner. First, a turn-on voltage is applied to a resistance connected to the gate of the power semiconductor device, so that the gate voltage gradually increases. Then, after a delay caused by a delay circuit, the same turn-on voltage is directly applied to the gate of the power semiconductor device, so that the gate voltage further increases, with the result that the device transitions to a steady on state. On the other hand, the power semiconductor device is turned off in the following manner. A turn-off voltage is applied to another resistance connected to the gate of the power semiconductor device, so that the gate voltage gradually decreases. Then, after a delay caused by another delay circuit, the same turn-off voltage is directly applied to the gate of the power semiconductor device, so that the gate voltage further decreases, with the result that the device transitions to an off state.

Thus, when turning on the power semiconductor device, the gate drive circuit of the above patent publication increases the gate voltage of the device in two steps, the second step being performed a predetermined time after the first step. Further, likewise, when turning off the power semiconductor device, the gate drive circuit decreases the gate voltage of the device in two steps, the second step being performed a predetermined time after the first step. Such gradual (or stepwise) increase and decrease in the gate voltage result in a reduced radiated noise level. Further, the switching loss is also reduced since the turn-on and turn-off times are reduced. Other prior art includes JP-A Nos. 2000-232347, 2003-189593, 2000-253646, 2003-319638, and 4-29558 (1992).

The gate drive circuit disclosed in the above JP-A-2001-37207 drives a power semiconductor device in such a way that the device exhibits a reduced radiated noise level and reduced switching loss. However, this gate drive circuit is disadvantageous in that if the arm in which the power semiconductor device is connected suffers a short circuit, a large current flows through the device since its gate voltage is relatively high, which may lead to degradation of the device. To avoid this, the gate voltage of the power semiconductor device may be reduced to increase its resistance to short circuiting. However, this results in an increase in the steady state loss in the device. Thus, with the gate drive circuit of the above patent publication, a power semiconductor device cannot exhibit sufficient resistance to short circuiting. (Decreasing its gate voltage to enhance the resistance increases the steady state loss in the device.)

SUMMARY OF THE INVENTION

The present invention has been devised to solve the above problems. It is, therefore, an object of the present invention to provide a gate drive circuit which can drive a power semiconductor device in such a way that the device exhibits sufficient resistance to short circuiting while preventing an increase in its steady state loss, and which enables the switching characteristics of the power semiconductor device to be arbitrarily set.

The features and advantages of the present invention may be summarized as follows.

According to one aspect of the present invention, a gate drive circuit includes a turn-on side circuit for turning on a gate of a power switching device, the turn-on side circuit including a first turn-on side power supply circuit and a second turn-on side power supply circuit, the first turn-on side power supply circuit including:

a first turn-on voltage source for supplying a first turn-on voltage;

first turn-on wiring connected between the first turn-on voltage source and the gate of the power switching device; and a first turn-on switch connected in the first turn-on wiring and controlled by a gate drive signal; and the second turn-on side power supply circuit including:

a second turn-on voltage source for supplying a second turn-on voltage applied to the gate of the power switching device to set the power switching device in a steady (on) state;

second turn-on wiring connected between the second turn-on voltage source and the gate of the power switching device;

a second turn-on switch connected in the second turn-on wiring; and a turn-on side delay circuit for delaying the gate drive signal and passing it to the second turn-on switch;

wherein the first and second turn-on voltages are higher than a threshold voltage of the power switching device, and the first turn-on voltage is lower than the second turn-on voltage.

According to another aspect of the present invention, a gate drive circuit includes a turn-off side circuit for turning off a gate of a power switching device, the turn-off side circuit including a first turn-off side power supply circuit and a second turn-off side circuit, the first turn-off side power supply circuit including:

a first turn-off voltage source for supplying a first turn-off voltage;

first turn-off wiring connected between the first turn-off voltage source and the gate of the power switching device; and a first turn-off switch connected in the first turn-off wiring and controlled by a gate drive signal; and the second turn-off side circuit including:

a ground terminal;

second turn-off wiring connected between the ground terminal and the gate of the power switching device;

a second turn-off switch connected in the second turn-off wiring; and a turn-off side delay circuit for delaying the gate drive signal and passing it to the second turn-off switch;

wherein the first turn-off voltage is lower than a voltage applied to (the gate of) the power switching device to set the power switching device in a steady (on) state.

According to another aspect of the present invention, a gate drive circuit includes:

switching delay means for receiving information about a temperature of a power switching device and decreasing the turn-on speed of the power switching device with increase in the temperature.

According to another aspect of the present invention, a gate drive circuit includes:

a turn-on circuit for turning on a gate of a power switching device, wherein the turn-on circuit includes an upper limiter for limiting the voltage input to the gate so as not to exceed a first predetermined value.

According to another aspect of the present invention, a gate drive circuit includes:

a turn-off circuit for turning off a gate of a power switching device, wherein the turn-off circuit includes a lower limiter for maintaining the voltage input to the gate at a second predetermined value.

Other and further objects, features and advantages of the invention will appear more fully from the following description.

BRIEF DESCRIPTION OF THE DRAWINGS

FIG. 16 shows the turn-on side variable voltage circuit of the third embodiment.

FIG. 17 shows the circuit zener diode 1 is substantially electrically shorted and has a low resistance R1;

FIG. 18 is a table showing characteristics of a power switching device driven by the gate drive circuit;

FIG. 19 is circuit diagram illustrating turn-off side variable voltage circuit according to fourth embodiment;

DETAILED DESCRIPTION OF THE PREFERRED EMBODIMENTS

First Embodiment

Figure 1:
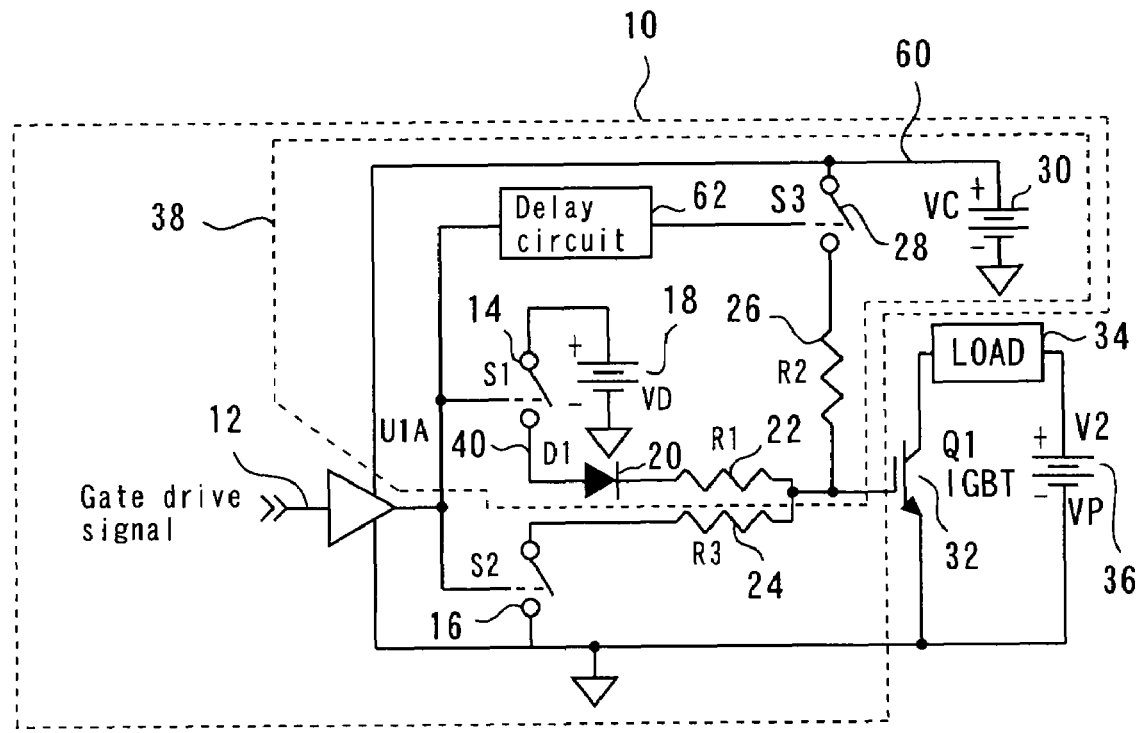
FIG. 1 is a circuit diagram illustrating the configuration of gate drive circuit.

A first embodiment of the present invention provides a gate drive circuit that can drive a power switching device in such a way as to optimize its turn-on characteristics. FIG. 1 is a circuit diagram illustrating the configuration of this gate drive circuit (10). In FIG. 1, the gate drive circuit 10 drives the gate of a power switching device 32. The power switching device 32 may be a voltage driven bipolar transistor, a MOSFET, etc. The following description of the present embodiment assumes that the device 32 is an IGBT (Insulated Gate Bipolar Transistor) and constitutes a portion of an arm (a bridge or shunt arm).

Figure 2:
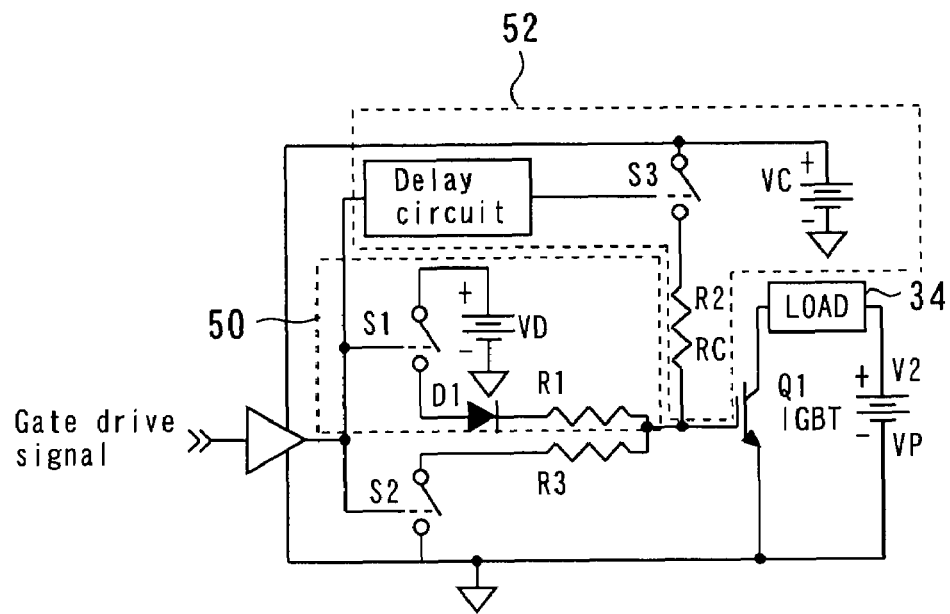
FIG. 2 is a circuit diagram illustrating first turn-on side power supply circuit and a second turn-on side power supply circuit.

The gate drive circuit 10 includes a turn-on side circuit 38 for turning on the power switching device 32. The turn-on side circuit 38 includes a first turn-on side power supply circuit 50 and a second turn-on side power supply circuit 52, as shown in FIG. 2. First the first turn-on side power supply circuit 50 will be described with reference to FIG. 1. The first turn-on side power supply circuit 50 includes a first turn-on voltage source 18 for generating a first turn-on voltage VD. The voltage VD is set so as to reduce the short-circuit current flowing in the power switching device 32 when a short circuit occurs through the arm including the device. That is, the voltage VD is higher than the threshold voltage of the power switching device 32 but is such that, with this voltage (or a voltage lower than that) applied to its gate, the power switching device 32 exhibits no more than tolerable changes in characteristics when the arm suffers a short circuit.

The first turn-on voltage source 18 is connected to a first turn-on switch 14 which is turned on and off in response to the gate drive signal received from a gate drive signal transmission unit 12. The first turn-on switch 14 is made up of a bipolar transistor or a MOSFET.

A diode 20 is coupled to the first turn-on switch 14 primarily to prevent a reverse current from flowing through the first turn-on voltage source 18. Further, a first turn-on resistance 22 is coupled to the diode 20 to control the turn-on speed of the power switching device 32. The first turn-on resistance 22 has a value R1 and is connected to the gate of the power switching device 32.

Thus, according to the present embodiment, the first turn-on side power supply circuit 50 includes the first turn-on voltage source 18, the first turn-on switch 14, the diode 20, and the first turn-on resistance 22 which are connected in series to one another in that order, with the other end of the turn-on resistance 22 being connected to the gate of the power switching device 32. The wiring connected between these components is referred to as "first turn-on wiring 40."

On the other hand, the second turn-on side power supply circuit 52 of the turn-on side circuit 38 is formed so as not to overlap the first turn-on side power supply circuit 50. Like the first turn-on side power supply circuit 50, the second turn-on side power supply circuit 52 supplies a voltage to the gate of the power switching device 32. The configuration of the second turn-on side power supply circuit 52 will now be described with reference to FIG. 1.

The second turn-on side power supply circuit 52 includes a second turn-on voltage source 30 for generating a second turn-on voltage VC. The voltage VC is set such that applying it to the gate of the power switching device 32 sets the device in a steady on state. It should be noted that the voltage VC is higher than the voltage VD generated by the first turn-on voltage source 18.

The second turn-on voltage source 30 is connected to a second turn-on switch 28. Like the first turn-on switch 14, the second turn-on switch 28 may be made up of a bipolar transistor or a MOSFET. It is turned on and off in response to the gate drive signal received from the gate drive signal transmission unit 12. Further, a turn-on side delay circuit 62 is connected between the gate drive signal transmission unit 12 and the second turn-on switch 28, as shown in FIG. 1. The turn-on side delay circuit 62 delays the gate drive signal and passes it to the second turn-on switch 28. That is, the signal sent from the gate drive signal transmission unit 12 to the delay circuit 62 is not immediately applied to the second turn-on switch 28, but is delayed a predetermined period of time.

Figure 5:
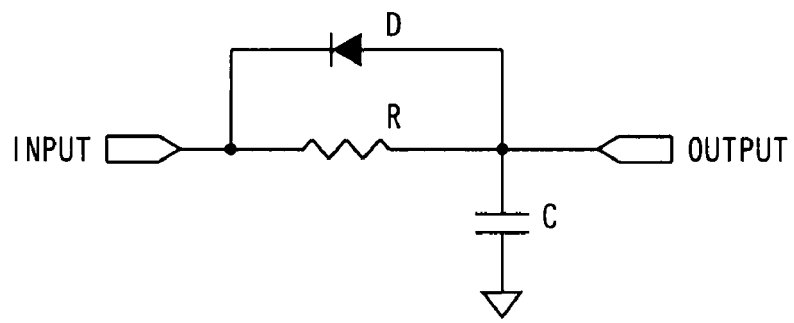
FIG. 5 is circuit diagram illustrating turn-on side delay circuit.

The turn-on side delay circuit 62, represented by a block in FIG. 1, is shown in detail in FIG. 5. FIG. 5 shows the configuration of the turn-on side delay circuit 62. In the figure, symbol INPUT denotes the gate drive signal received from the gate drive signal transmission unit 12, and OUTPUT denotes the delayed gate drive signal to be output to the second turn-on switch 28. It should be noted that the gate drive signal has two steady state voltage levels: high and low. In the delay circuit 62 shown in FIG. 5, when the received gate drive signal changes from the low level to the high level, the output signal OUTPUT also changes from the low level to the high level, but with a delay caused by a first order lag filter made up of a resistance R and capacitance C (also see FIG. 6). When the received gate drive signal changes from the high level to the low level, on the other hand, the output signal OUTPUT changes immediately without a delay since the resistance R is shunted by a diode D so as to bypass the forward current from the output terminal and the capacitance C.

Figure 6:
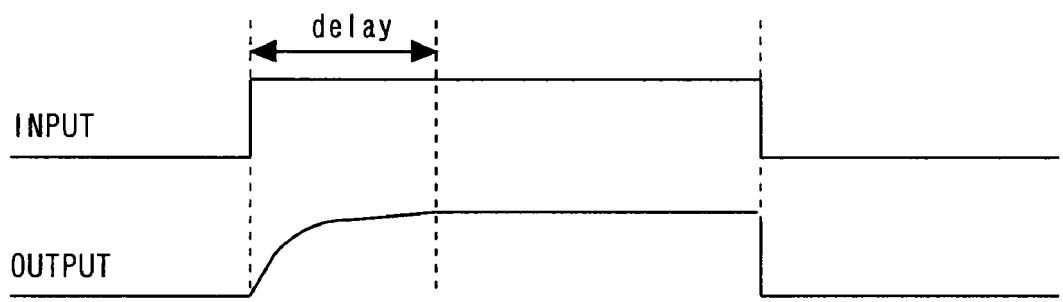
FIG. 6 shows the waveforms of the input and output signals INPUT and OUTPUT of the turn-on side delay circuit.

FIG. 6 shows the waveforms of the input and output signals INPUT and OUTPUT of the turn-on side delay circuit 62 (having the configuration described above). As shown in FIG. 6, the turn-on side delay circuit 62 outputs the output signal OUTPUT which is delayed a predetermined period of time from the received signal INPUT. This delay time (see FIG. 6) can be arbitrarily adjusted by changing the value of the capacitance C, etc. shown in FIG. 5.

A second turn-on resistance 26 is connected to the second turn-on switch 28 controlled by the turn-on side delay circuit 62 (having the configuration described above). The second turn-on resistance 26 has a value R2 and is connected to the gate of the power switching device 32 to control the turn-on speed of the power switching device 32.

Thus, according to the present embodiment, the second turn-on side power supply circuit 52 includes the second turn-on voltage source 30, the second turn-on switch 28 (which is controlled by the turn-on side delay circuit 62), and the second turn-on resistance 26 which are connected in series to one another in that order, with the other end of the second turn-on resistance 26 being connected to the gate of the power switching device 32. The wiring connected between these components is referred to as "second turn-on wiring 60."

This completes the description of the turn-on side circuit 38 of the gate drive circuit 10 of the present embodiment. The turn-off side circuit of the gate drive circuit 10 will now be described. The turn-off side circuit is provided to turn off the power switching device 32. According to the present embodiment, the turn-off side circuit includes a turn-off side switch 16 which is turned on and off in response to the gate drive signal received from the gate drive signal transmission unit 12. One end of the turn-off side switch 16 is connected to a ground terminal, and the other end is connected to a turn-off resistance 24. The turn-off resistance 24 has a value R3 and is connected to the gate of the power switching device 32 to reduce the turn-off speed of the power switching device 32. This completes the description of the configuration of the turn-off side circuit.

According to the present embodiment, a load 34 and a voltage source 36 are connected in series to the power switching device 32, as shown in FIG. 1, and the power switching device 32 is controlled to connect and disconnect the load 34 to and from the voltage source 36.

Figure 3:
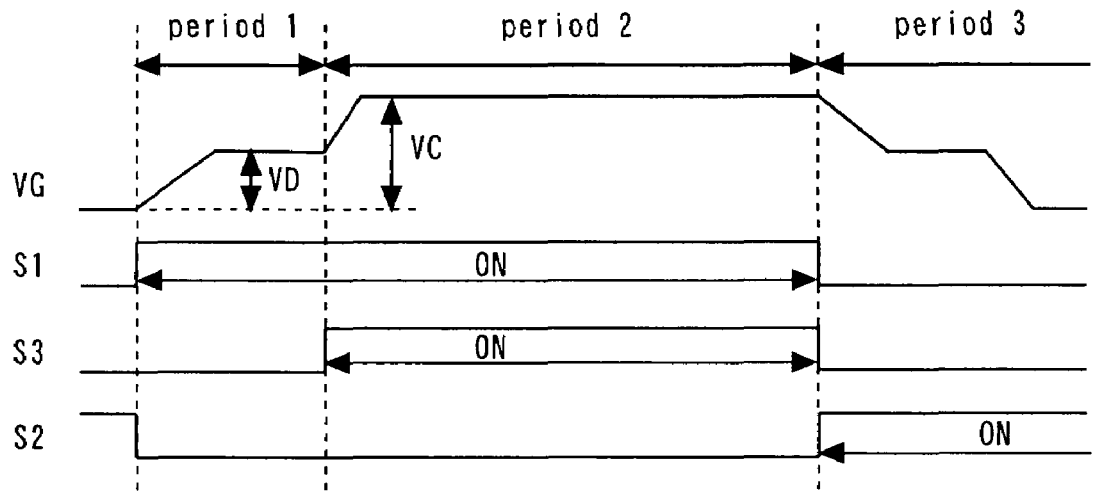
FIG. 3 is a timing chart illustrating the operation of the gate drive circuit of the first embodiment.

FIG. 3 is a timing chart illustrating the operation of the gate drive circuit 10 of the present embodiment. In FIG. 3, the period 1 is when the power switching device 32 transitions from an off state to an intermediate state and remains there. Further, the subsequent period 2 is when the power switching device 32 transitions from the intermediate state to a steady on state and remains there, and the period 3 subsequent to the period 2 is when the device 32 transitions from the steady on state to an off state. The gate drive circuit 10 operates during the period 1 as follows. First, the gate drive signal transmission unit 12 sends a turn-on signal (hereinafter referred to as an "H signal") to the first turn-on switch 14 by changing the level of the gate drive signal from a low level to a high level, in order to turn on the gate of the power switching device 32. (It should be noted that the turn-on side delay circuit 62 also receives the same H signal concurrently.) This signal turns on the first turn-on switch 14. At that time, the second turn-on switch 28 and the turn-off side switch 16 are off. Therefore, only the first turn-on side power supply circuit 50 is turned on or connected to the gate of the power switching device 32. As a result, the voltage VD is applied through the first turn-on resistance 22 to the gate of the power switching device 32. It should be noted that actually the voltage on the gate of the power switching device 32 gradually increases to equal the applied voltage VD due to the action of the first turn-on resistance 22.

The gate drive circuit 10 operates during the period 2 as follows. At the beginning of the period 2, the second turn-on switch 28 receives from the turn-on side delay circuit 62 an H signal which is substantially identical to but delayed from the H signal received by the first turn-on switch 14. This signal turns on the second turn-on switch 28. As a result, the voltage VC is applied through the second turn-on resistance 26 to the gate of the power switching device 32. That is, the timing of the beginning of the period 2 and hence the length of the period 1 depend on the amount of delay applied to the signal by the turn-on side delay circuit 62. According to the present embodiment, by adjusting the value of the capacitance, etc. in the turn-on side delay circuit 62, the length of the period 1 is set equal to the time required to detect a short circuit in the arm if it occurs and eliminate the short circuit path, which is generally approximately a few microseconds.

Since both the first turn-on switch 14 and the second turn-on switch 28 are turned on during the period 2, a current may flow through the path formed by the second turn-on voltage source 30, the second turn-on switch 28, the second turn-on resistance 26, the first turn-on resistance 22, the first turn-on switch 14, and the first turn-on voltage source 18. This may damage the first turn-on voltage source 18 and the first turn-on switch 14. According to the present embodiment, to avoid this, the diode 20 is provided in the path to prevent the flowing of such a current.

The gate drive circuit 10 operates during the period 3 as follows. The period 3 is when the power switching device 32 transitions to an off state. At the beginning of the period 3, the gate drive signal transmission unit 12 sends a turn-off signal (hereinafter referred to as an "L signal") to the switches by changing the level of the gate drive signal from a high level to a low level, in order to turn off the gate of the power switching device 32. This signal turns off the first turn-on switch 14 and the second turn-on switch 28 and turns on the turn-off side switch 16. As a result, only the turn-off side circuit is turned on or connected to the gate of the power switching device 32. Since one end of the turn-off side switch 16 is connected to a ground terminal, the voltage on the gate of the power switching device 32 gradually decreases, thereby turning off the device.

Figure 7:
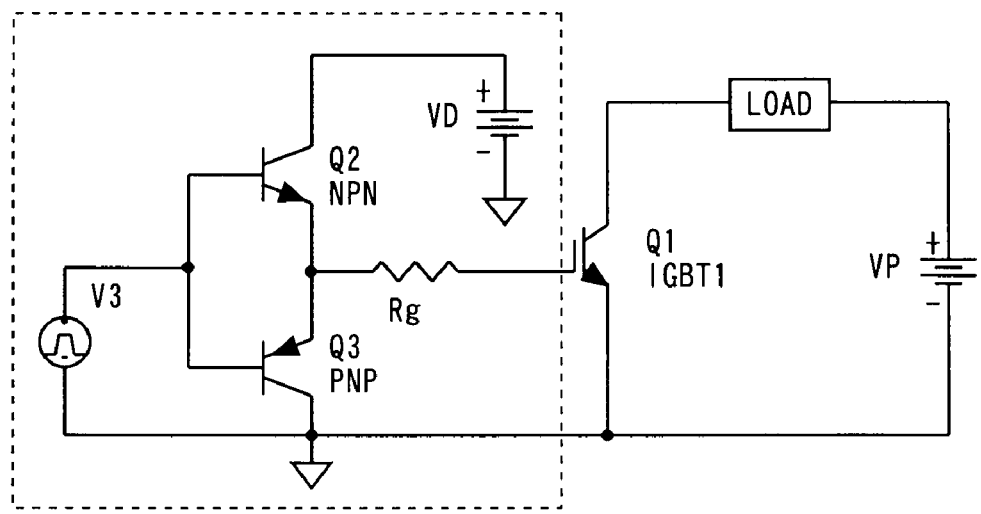
FIG. 7 shows a first comparative gate drive circuit and an IGBT Q1 connected thereto.

To better understand the features of the present embodiment, it will be helpful to describe comparative gate drive circuits with reference to FIGS. 7 to 10. FIG. 7 shows a first comparative gate drive circuit and an IGBT Q1 connected thereto, wherein the gate drive circuit is shown enclosed within a broken line block. Referring to FIG. 7, the IGBT Q1 is turned on by turning on a transistor Q2 and thereby applying a voltage VD to the gate of the IGBT Q1. On the other hand, the IGBT Q1 is turned off by turning on a transistor Q3 and thereby pulling down the voltage on the gate of the IGBT Q1 to ground. It should be noted that the turn-on and turn-off speeds depend on the value of the gate resistance Rg.

Figure 8:
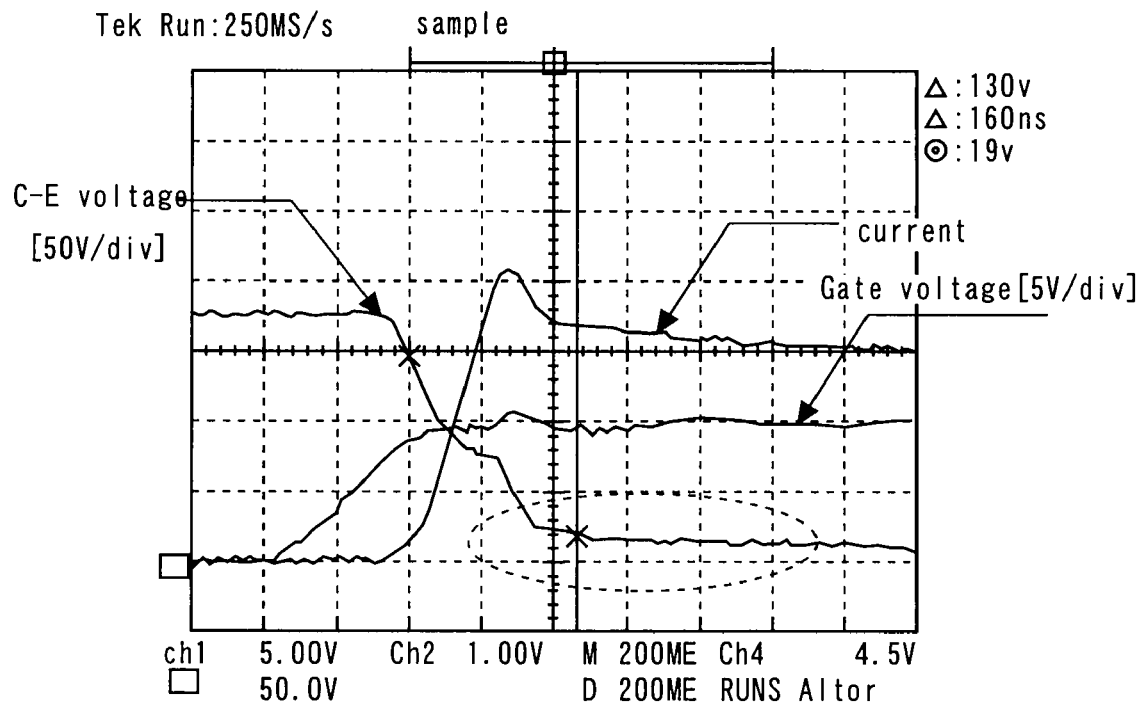
FIG. 8 shows the waveforms of the collector-emitter voltage VCE, the gate voltage, and the current of the IGBT Q1.

FIG. 8 shows the waveforms of the collector-emitter voltage VCE, the gate voltage, and the current of the IGBT Q1 (driven by the first comparative gate drive circuit) when the IGBT Q1 is turned on, wherein the horizontal axis represents time. It should be noted that the collector-emitter voltage VCE of the IGBT Q1 remains at approximately 10 V for a considerable period of time immediately after the device is turned on (although the collector-emitter saturation voltage VCE (SAT) is approximately 2 V), as shown in FIG. 8. This portion of the collector-emitter voltage VCE curve is encircled by a broken line in the figure. This means that, with the first comparative gate drive circuit, the turn-on loss in the IGBT Q1 is high. Thus, reducing the switching speed (i.e., dV/dt, or dI/dt) of the device results in increased loss, since the collector-emitter voltage VCE gradually decreases. However, increasing the switching speed to prevent this results in an increase in the noise radiated from the device. Thus, there is a trade-off between the loss and the radiated noise (hereinafter referred to as the "first trade-off"). Therefore, it has been difficult to reduce the loss in the device while preventing an increase in the noise radiated from it.

Figure 9:
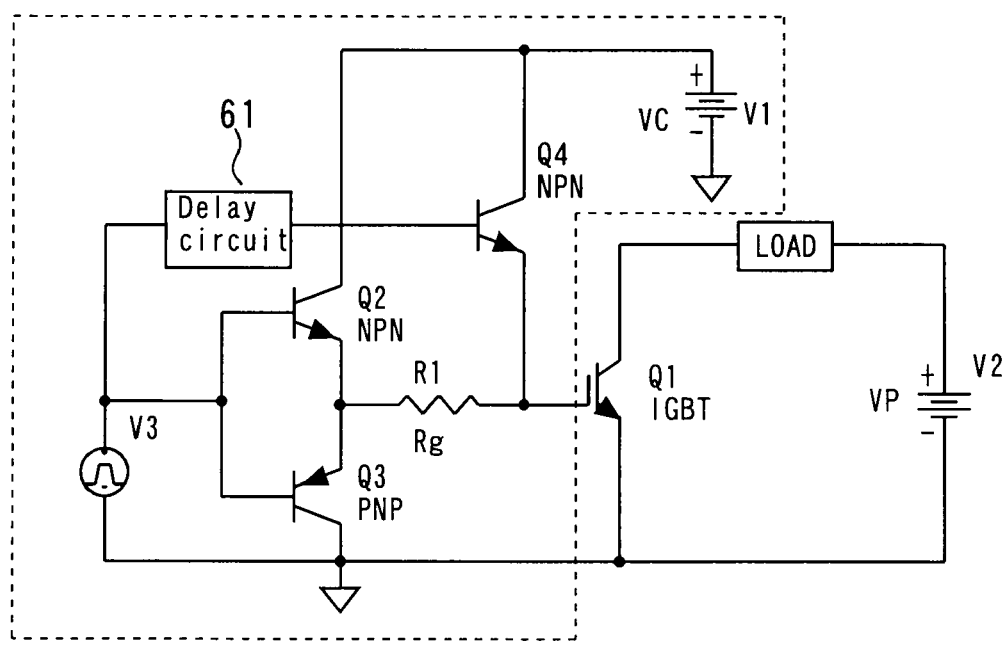
FIG. 9 is a diagram illustrating a second comparative gate drive circuit and an IGBT Q1 connected thereto.

FIG. 9 is a diagram illustrating a second comparative gate drive circuit and an IGBT Q1 connected thereto, wherein the gate drive circuit is shown enclosed within a broken line block. This gate drive circuit is disclosed in JP-A-2001-37207 noted above and differs from the above first comparative gate drive circuit in that the circuit for turning on the IGBT includes a delay circuit 61. Referring to FIG. 9, the IGBT is turned on in the following manner. First, a switch Q2 is turned on to apply a voltage VC from a voltage source V1 to a resistance R1 connected to the gate of the IGBT, so that the voltage on the gate gradually increases. Then, after a delay caused by the delay circuit 61, a switch Q4 which is directly connected between the voltage source V1 and the gate of the IGBT is turned on to directly apply the voltage VC to the gate. As a result, the voltage on the gate of the IGBT quickly increases to equal the voltage VC.

Thus, the second comparative gate drive circuit turns on the IGBT by increasing the gate voltage of the IGBT in two steps using the delay circuit 61, thereby circumventing the first trade-off (between the loss and the radiated noise). Specifically, the voltage VC is first applied to the resistance R1 through the switch Q2 to gradually increase the voltage on the gate of the IGBT and thereby prevent an increase in the noise radiated from the IGBT. Then, after a delay produced by the delay circuit 61, the same voltage VC is directly applied to the gate of the IGBT through the switch Q4 to fully turn on the IGBT and thereby reduce the collector-emitter voltage VCE and hence the loss in the device, thus circumventing the first trade-off (between the loss and the radiated noise).

However, the second comparative gate drive circuit may not able to drive the IGBT in such a way that the IGBT exhibits sufficient resistance to short circuiting. This problem will be described in detail.

Figure 10:
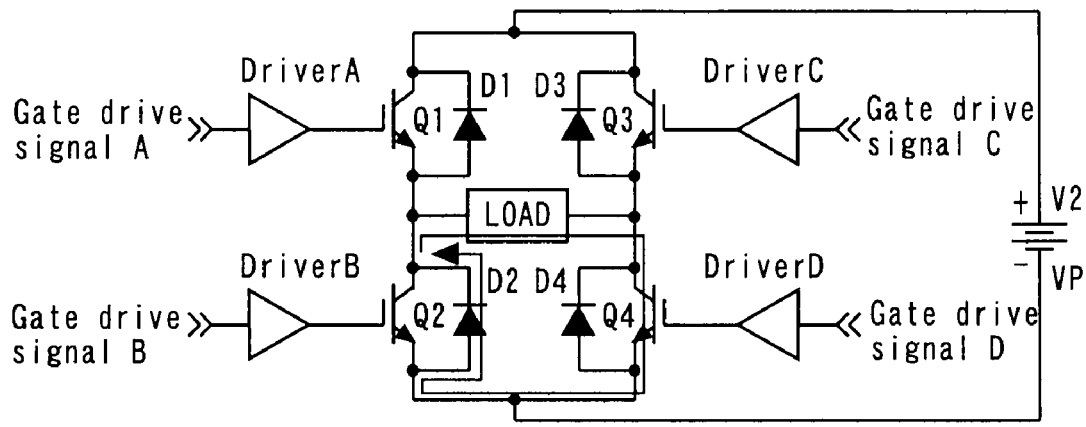
FIG. 10 shows an exemplary H-bridge.

An inverter, for example, generally includes an H-bridge or a three-phase bridge made up of parallel-connected arms each including series-connected power switching devices. FIG. 10 shows an exemplary H-bridge (10). Referring to FIG. 10, the H-bridge 10 includes four IGBTs Q1, Q2, Q3, and Q4. Diodes D1, D2, D3, and D4 are coupled in parallel with the IGBTs Q1, Q2, Q3, and Q4, respectively. The IGBTs are turned on and off by gate drivers DriverA, DriverB, DriverC, and DriverD, respectively.

It should be noted that in FIG. 10 symbol LOAD denotes a load which is assumed to be inductive. In the H-bridge shown in FIG. 10, when the IGBTs Q1, Q2, and Q3 are turned off and the IGBT Q4 is turned on, a current may flow through the diode D2 and the IGBT Q4. In such an event, the forward voltage drop across the diode D2 is applied between the collector and emitter of the IGBT Q2. Then if the IGBT Q1 is turned on, a current begins to flow through the path including the load LOAD and the IGBTs Q1 and Q4. At that time, the current flowing through the diode D2 decreases, so that the voltage VP of a voltage source V2 is applied between the collector and emitter of the IGBT Q2 and across the diode D2. As a result, the input capacitance between the gate and emitter of the IGBT Q2 is charged through the feedback capacity between the collector and gate since the collector-emitter voltage of the IGBT Q2 dramatically increases, resulting in an increase in the gate voltage of the IGBT Q2. If the voltage on the gate of the IGBT Q2 exceeds the threshold voltage, the IGBT Q2 turns on. That is, both the IGBTs Q1 and Q2 are in an on state, meaning that the arm has suffered a short circuit.

This leads to an excessive current flowing through the arm, which may damage the IGBTs Q1 and Q2 or otherwise cause these IGBTs to malfunction.

Assume, for example, that an arm of the H-bridge shown in FIG. 10 includes a power switching device (IGBT) such as the IGBT Q1 shown in FIG. 9 and suffers a short circuit. What happens in such a case will be described in detail. Referring now to FIG. 9, as described above, the voltage VC generated by the drive circuit voltage source V1 is first applied through the switch Q2 and the resistance R1 to the gate of the IGBT Q1, so that the voltage on the gate gradually increases. If a short circuit occurs in the arm at that time, then a large current may flow through the IGBT Q1, thereby damaging it. To prevent this from happening, the value of the resistance R1 may be increased to prevent a large current from flowing through the IGBT Q1 when the arm suffers a short circuit. However, this reduces the speed at which the collector-emitter voltage VCE of the IGBT Q1 falls, resulting in increased switching loss. Another method for reducing the current flowing in the IGBT Q1 in the case of a short circuit in the arm is to reduce the voltage VC of the drive circuit voltage source V1. However, this increases the steady state loss in the IGBT Q1. Thus, there is a trade-off between the resistance to short circuiting and the steady state loss (hereinafter referred to as the "second trade-off"). Therefore, it has been difficult to increase the resistance to short circuiting while preventing an increase in the steady state loss. The second comparative gate drive circuit cannot solve this problem.

On the other hand, the gate drive circuit of the present embodiment can solve such a problem, as described below. Referring now to FIG. 1, in this gate drive circuit, the first turn-on side power supply circuit 50 for turning on the gate of the power switching device 32 (or IGBT Q1) includes the dedicated first turn-on voltage source 18. Referring now to FIG. 3, during the period 1 (when the power switching device 32 transitions from an off state to an intermediate on state and remains there), the gate of the power switching device 32 receives the voltage VD from the first turn-on voltage source 18 through the resistance 22. Therefore, during this period the voltage on the gate is maintained equal to or less than the voltage VD. With such a voltage on its gate, the power switching device 32 exhibits no more than tolerable changes in characteristics if the arm suffers a short circuit. Further, the length of the period 1 is set equal to or longer than the time required to detect a short circuit in the arm if it occurs and eliminate the short circuit path.

In the period 2, the second turn-on side power supply circuit 52 causes the power switching device 32 to quickly transition to and remain in an steady on state. Therefore, in this period, the collector-emitter voltage VCE of the power switching device 32 is quickly reduced to a low value. On the other hand, the collector-emitter voltage VCE of the first comparative gate drive circuit remains high for a considerable period of time immediately after the device is turned on. (In FIG. 8, this portion of the collector-emitter voltage VCE curve is encircled by a broken line.) Thus, the gate drive circuit of the present embodiment drives a power switching device in such a way that the device exhibits reduced turn-on loss.

Figure 4:
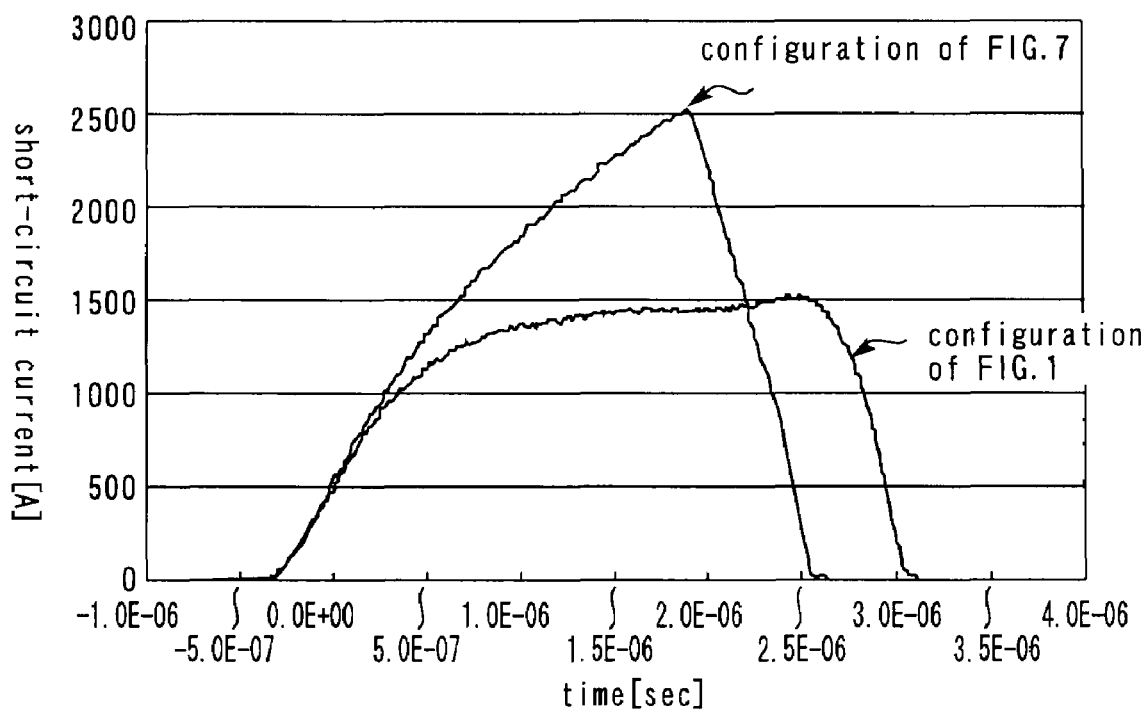
FIG. 4 shows the short-circuit currents flowing in two power switching devices driven by the gate drive circuit of this invention and the first comparative gate drive circuit, respectively.

The advantages of the present embodiment may be summarized as follows. With the gate drive circuit 10 of the present embodiment, a power switching device can exhibit sufficient resistance to short circuiting during the period 1 (when the device transitions to and remains in an intermediate on state), as well as quickly transition to and remain in a steady on state in the subsequent period 2, which results in reduced turn-on loss. Further, this power switching device (driven by the gate drive circuit 10) can exhibit high resistance to short circuiting even when it is connected in an arm. FIG. 4 shows the short-circuit currents flowing in two power switching devices driven by the gate drive circuit of the present embodiment and the first comparative gate drive circuit, respectively, when they were operating in the period 1 (transitioning to an intermediate on state). These short-circuit events were created by intentionally causing a short circuit in the arm. FIG. 4 indicates that the power switching device driven by the gate drive circuit of the present embodiment exhibits a lower short-circuit current than the power switching device driven by the first comparative gate drive circuit.

The first turn-on voltage source 18, the first turn-on switch 14, the diode 20, and the first turn-on resistance 22 in the first turn-on side power supply circuit 50 of the present embodiment have been described as being connected in series to one another in that order, with the other end of the turn-on resistance 22 being connected to the gate of the power switching device 32. It should be noted, however, that it is only necessary that the first turn-on switch 14, the diode 20, and the first turn-on resistance 22 be connected in series between the first turn-on voltage source 18 and the gate of the power switching device 32. That is, the first turn-on switch 14, the diode 20, and the first turn-on resistance 22 may be connected to each other in any order with the same effect.

Although the turn-on side delay circuit 62 of the present embodiment has been described as having the configuration shown in FIG. 5, it may have any suitable configuration that allows the circuit to delay a gate drive signal and passes it to the second turn-on switch 28.

Although the gate drive circuit of the present embodiment has been described as including the diode 20, this diode may be omitted from the circuit while still retaining the advantages of the present embodiment.

Second Embodiment

Figure 11:
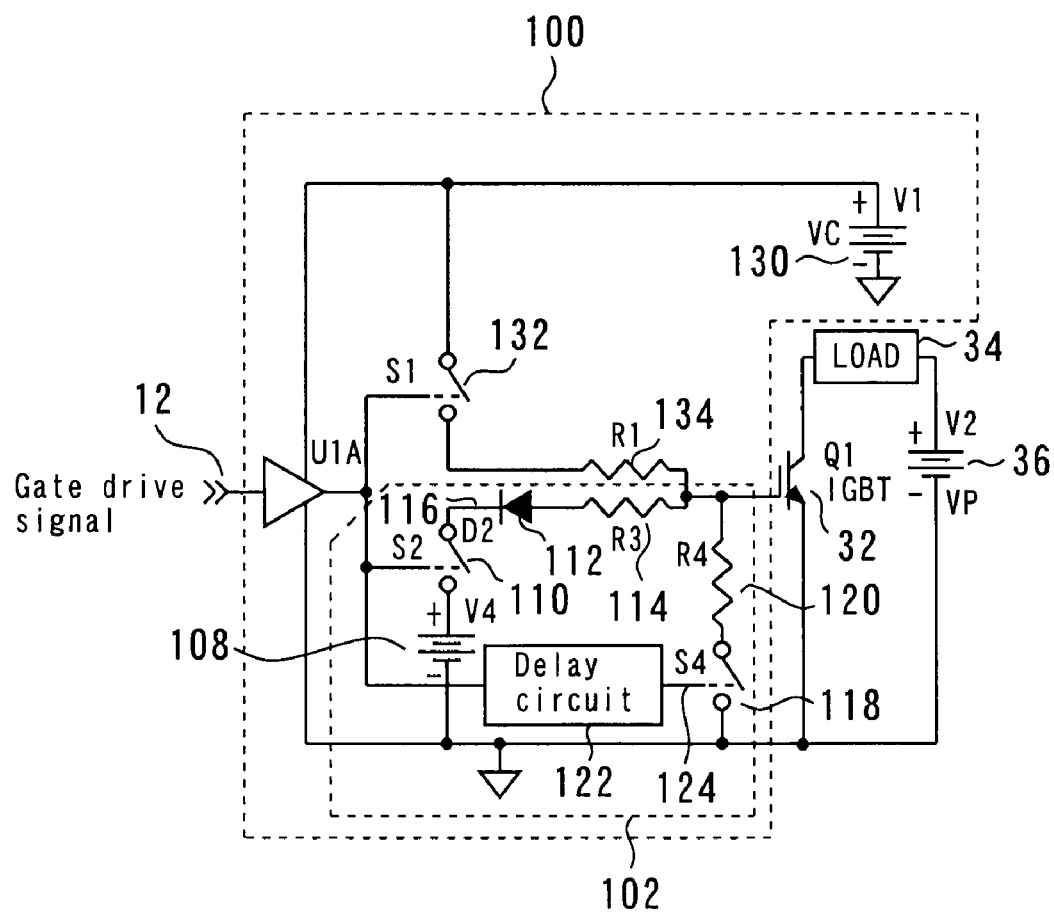
FIG. 11 is a diagram illustrating the configuration of gate drive circuit of second embodiment.

A second embodiment of the present invention provides a gate drive circuit that can drive a power switching device in such way as to optimize its turn-off switching characteristics. FIG. 11 is a diagram illustrating the configuration of this gate drive circuit (100). Referring to FIG. 11, the gate drive circuit 100 includes a turn-off side circuit 102 for turning off a power switching circuit 32. Further, the gate drive circuit 100 also includes a turn-on side circuit (which does not overlap the turn-off side circuit 102) for turning on the power switching circuit 32. It should be noted that the power switching device 32 is set to a steady on state by turning on a turn-on side switch 132 in the turn-on side circuit and thereby applying a voltage VC to the gate of the power switching device 32.

Figure 12:
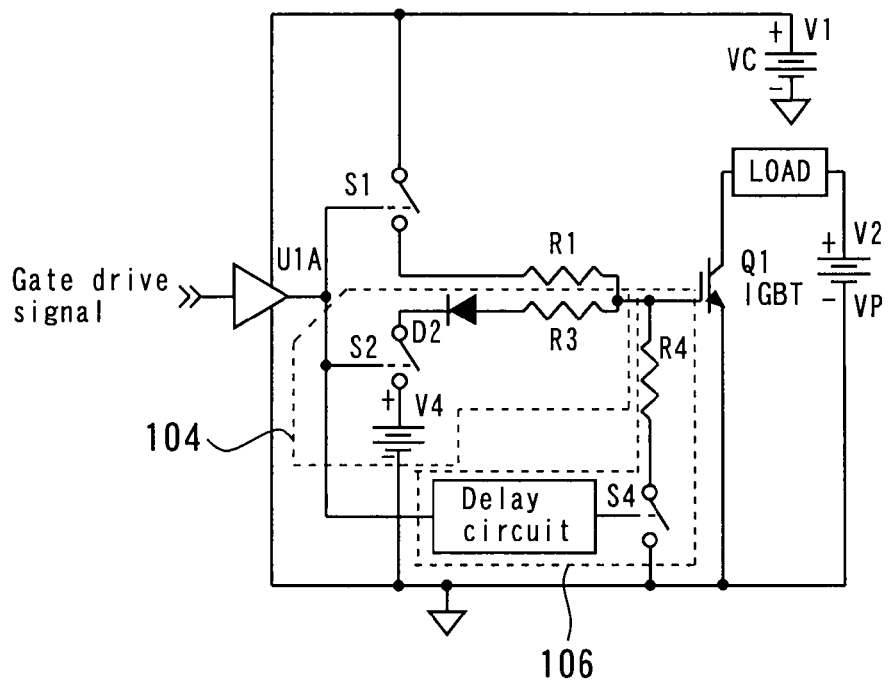
FIG. 12 is a diagram illustrating the turn-off side circuit of the second embodiment.

FIG. 12 is a diagram illustrating the turn-off side circuit 102 described with reference to FIG. 11. The turn-off side circuit 102 includes a first turn-off side power supply circuit 104 and a second turn-off side circuit 106, as shown in FIG. 12. First the first turn-off side power supply circuit 104 will be described with reference to FIG. 11. The first turn-off side power supply circuit 104 includes a first turn-off voltage source 108 for generating a voltage V4 which is supplied to the gate of the power switching device 32. It should be noted that the voltage V4 is lower than the steady state gate voltage of the power switching device 32 and slightly higher than the threshold voltage. Further, the voltage V4 is such that, with this voltage (or a voltage lower than that) applied to its gate, the power switching device 32 exhibits no more than tolerable changes in characteristics when the arm (in which the device 32 is connected) suffers a short circuit.

One end of the first turn-off voltage source 108 is connected a ground terminal, and the other end is connected to a first turn-off switch 110. The first turn-off switch 110 is turned on and off in response to the signal received from a gate drive signal transmission unit 12. The first turn-off switch 110 is made up of a bipolar transistor, a MOSFET, etc.

A diode 112 is connected to the first turn-off switch 110, and a first turn-off resistance 114 is connected to the diode 112. The first turn-off resistance 114 has a value R3 which is lower than the value R4 of a second turn-off resistance 120 (described later). The value R3 of the first turn-off resistance 114 determines the speed at which the power switching device 32 begins to transition from a steady on state toward an off state immediately after the voltage V4 is applied to the turn-off resistance 114, which is connected to the gate of the power switching device 32. (In its steady on state, the power switching device 32 has a voltage VC on its gate.) The value R3 of the first turn-off resistance 114 is low enough to quickly reduce the voltage on the gate of the power switching device 32 from the voltage VC to the voltage V4. More specifically, the value R3 is set such that the voltage on the gate of the power switching device 32 decreases from the voltage VC to the voltage V4 so quickly that an arm short-circuit event hardly coincides with this transition period if it occurs.

The first turn-on resistance 114 is connected to the gate of the power switching device 32, as described above. Thus, the first turn-off side power supply circuit 104 of the present embodiment includes the first turn-off voltage source 108, the first turn-off switch 110, the diode 112, and the first turn-off resistance 114 which are connected in series to one another in that order. The wiring connected between these components is referred to as "first turn-off wiring 116."

The second turn-off side circuit 106 will now be described. The second turn-off side circuit 106 includes a turn-off side delay circuit 122, a second turn-off switch 118, and the second turn-off resistance 120 which are connected in series to one another by second turn-off wiring 124. The second turn-off switch 118 has the same configuration as the first turn-off switch 110 and is turned on and off in response to a gate drive signal which is sent from the gate drive signal transmission unit 12 and delayed by the turn-off side delay circuit 122. The turn-off side delay circuit 122 has the configuration as shown in FIG. 5 and can be adjusted to provide any desired time delay.

One end of the second turn-off switch 118 is connected to a ground terminal, and the other end is connected to the second turn-off resistance 120. The second turn-off resistance 120 has a value R4, which determines the time required to reduce the gate voltage of the power switching device 32 to ground potential. According to the present embodiment, the value R4 of the second turn-off resistance 120 is higher than the value R3 of the first turn-off resistance 114.

This completes the description of the turn-off side circuit 102 of the gate drive circuit of the present embodiment. The turn-on side circuit will now be described. According to the present embodiment, the turn-on side circuit includes a turn-on side switch 132 and a turn-on side resistance 134 connected thereto. The turn-on side switch 132 is turned on and off in response to the gate drive signal received from the gate drive signal transmission unit 12. When the turn-on side switch 132 is turned on, the voltage VC generated by the turn-on side voltage source 130 is applied through the turn-on side resistance 134 to the gate of the power switching device 32. Thus, the turn-on side resistance 134 determines the turn-on speed of the power switching device 32.

Figure 13:
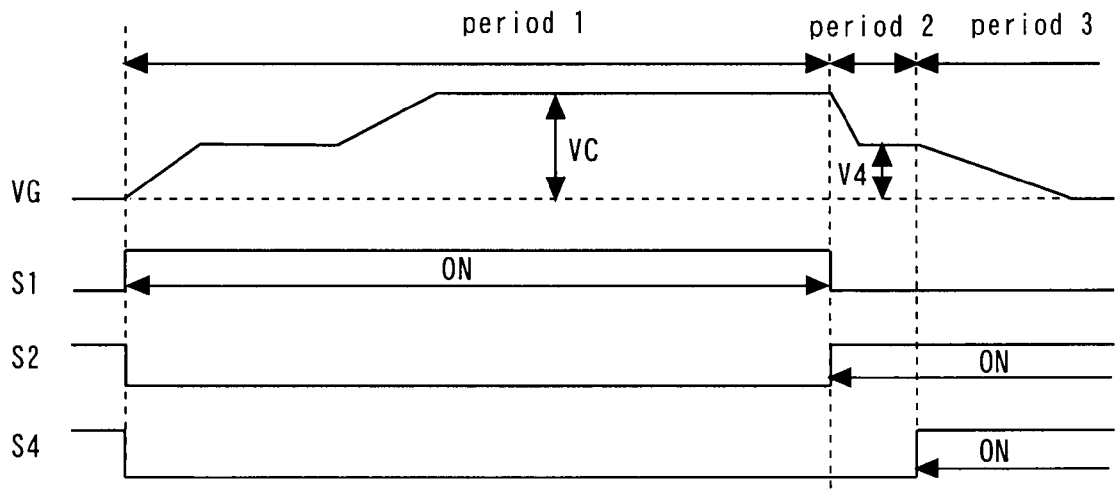
FIG. 13 is a timing chart illustrating the operation of the power switching device.

FIG. 13 is a timing chart illustrating the operation of the power switching device 32 driven by the gate drive circuit 100 of the present embodiment. In FIG. 13, the period 1 is when the power switching device 32 transitions to and remains in a steady on state. Specifically, during this period, the gate drive signal is maintained at a high level and hence only the turn-on side switch 132 is turned on. As a result, the voltage on the gate of the power switching device 32 increases to equal the voltage VC, setting and keeping the device in the steady on state.

The subsequent period 2 is when the power switching device 32 transitions from the steady on state to an intermediate state. Specifically, during this period, the gate drive signal is maintained at a low level and only the first turn-off switch 110 is turned on. As a result, the voltage V4 is applied through the first turn-off resistance 114 to the gate of the power switching device 32. That is, the first turn-off resistance 114 determines the time required for the voltage on the gate of the power switching device 32 to decrease to equal the voltage V4. The value R3 of the first turn-off resistance 114 is set such that the voltage on the gate of the power switching device 32 decreases from the voltage VC to the voltage V4 so quickly that an arm short-circuit event hardly coincides with this transition period if it occurs. (That is, the value R3 is sufficiently low.)

The period 3 subsequent to the period 2 is when the power switching device 32 transitions from the intermediate state to an off state. Specifically, this period begins when the second turn-off switch 118 is turned on in response to a gate drive signal from the turn-off side delay circuit 122. (This gate drive signal is delayed a predetermined period of time from the gate drive signal applied to the first turn-off switch 110.) Since the value R4 of the second turn-off resistance 120 (a discharge resistance) is greater than the value R3 of the first turn-off resistance 114, the voltage on the gate of the power switching device 32 decreases more slowly during the period 3 than during the period 2. (That is, during the period 3, the power switching device 32 transitions toward an off state more slowly than during the period 2.) As a result, the time rate of change of the load current (dI/dt) is low during the period 3, resulting in a reduced surge voltage due to the parasitic inductance. This completes the description of the operation of the power switching device 32 driven by the gate drive circuit 100 of the present embodiment.

Figure 14:
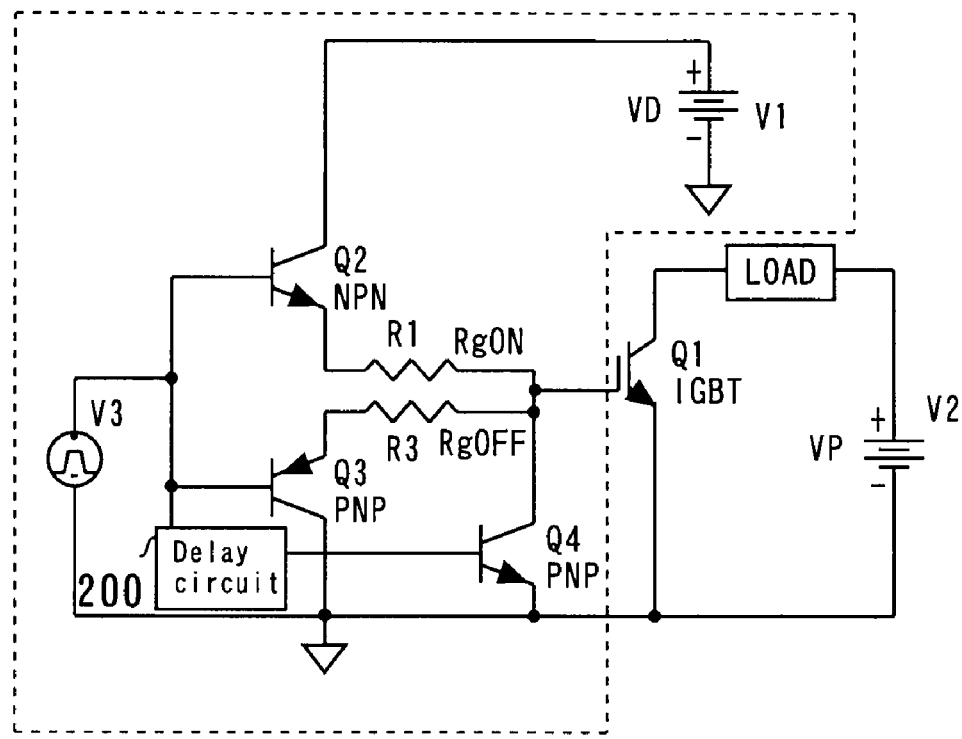
FIG. 14 shows the third comparative gate drive circuit and a power switching device (or IGBT) Q1 connected thereto.
Figure 15:
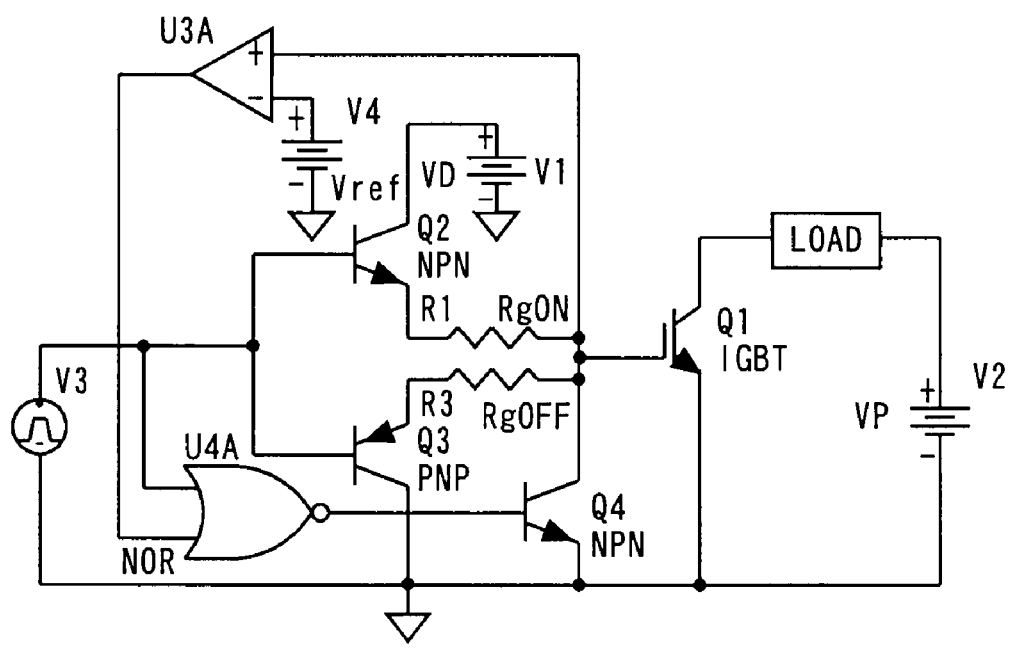
FIG. 15 shows another gate drive circuit having a configuration similar to that shown in FIG. 14.

To better understand the features of the present embodiment, it will be helpful to describe a third comparative gate drive circuit with reference to FIG. 14. FIG. 14 shows the third comparative gate drive circuit and a power switching device (or IGBT) Q1 connected thereto, wherein the gate drive circuit is shown enclosed within a broken line block. This gate drive circuit is disclosed in JP-A-2001-37207 noted above. Referring to FIG. 14, the power switching device Q1 is turned off by turning on a switch Q3. Specifically, when the switch Q3 is turned on, the voltage on the gate of the power switching device Q1 gradually decreases since a resistance R3 is connected between the gate of the power switching device Q1 and the switch Q3. If the voltage on the gate is let to decrease at this slow rate until the power switching device Q1 reaches a steady off state (which takes a relatively long time), there will be an increased turn-off loss. To prevent this, the third comparative gate drive circuit includes a delay circuit 200 and a switch 4, as shown in FIG. 14. The delay circuit 200 is designed to turn on the switch Q4 a predetermined time after the switch Q3 is turned on. Since the switch Q4 is directly connected between ground potential and the gate of the power switching device (i.e., there is no resistance connected between the switch Q4 and the gate), turning on the switch Q4 causes the voltage on the gate of the power switching device to quickly decrease to ground potential. It should be noted that FIG. 15 shows another gate drive circuit having a configuration similar to that shown in FIG. 14. Since this gate drive circuit is a variation of the third comparative gate drive circuit, no further description thereof will be provided.

Thus, the third comparative gate drive circuit turns off the power switching device Q1 in the following manner. First, the switch Q3 is turned on, so that the voltage on the gate of the power switching device gradually decreases. Then, a predetermined time after the turning on of the switch Q3, the switch Q4 is turned on to quickly reduce the voltage on the gate of the power switching device to ground potential and thereby quickly change the state of the device to a steady off state.

This circumvents the first trade-off (between the switching speed and the radiated noise). However, the third comparative gate drive circuit is disadvantageous in that the power switching device does not exhibit sufficient resistance to short circuiting during the period between the turning on of the switch Q3 and the turning on of the switch Q4 since the voltage on its gate gradually decreases during this period. Furthermore, since the value of resistance R3 (connected to the gate of the power switching device) is set high to reduce the noise radiated from the device, it takes a long time for the voltage on the gate of the power switching device to reach ground potential. Reducing the value of the resistance R3 to prevent this, however, causes the power switching device to rapidly transition from a steady on state to an off state, resulting in an increased radiated noise level. Thus, there is a trade-off between the turn-off speed and the radiated noise (hereinafter referred to as the third trade-off). Therefore, it has been difficult to increase the turn-off speed of the device while preventing an increase in the noise radiated from it.

On the other hand, the gate drive circuit of the present embodiment can solve this problem, as described below. Referring to FIGS. 11 to 13, the voltage on the gate of the power switching device 32 quickly decreases to equal the voltage V4 immediately after the first turn-off switch 110 is turned on. It should be noted that the voltage V4 is slightly higher than the threshold voltage of the power switching device 32 and is such that, with this voltage applied to its gate, the power switching device 32 exhibits no more than tolerable changes in characteristics when the arm (in which the device 32 is connected) suffers a short circuit. That is, the power switching device 32 exhibits increased resistance to short circuiting when it transitions to an off state. Since its gate voltage is quickly reduced from a steady state value to a value equal to the voltage V4, the power switching device 32 driven by the gate drive circuit of the present embodiment takes a shorter time to reach an off state, as compared to the power switching device driven by the third comparative gate drive circuit, resulting in reduced turn-off loss. After the gate voltage has decreased to equal the voltage V4, the second turn-off side circuit 106 is turned on to gradually further decreases it to ground potential, thereby causing the device to gradually transition to a steady off state. Thus, the gate drive circuit of the present embodiment can circumvent the third trade-off, that is, can increase the turn-off speed of the device while preventing an increase in the noise radiated from it.

It should be noted that the relative positions of the diode 112 and the first turn-off resistance 114 may be switched with the same effect. Further, the diode 112 performs the same function as the diode 20 of the first embodiment and may be omitted from the gate drive circuit while still retaining the advantages of the present embodiment (that is, such a gate drive circuit can still drive the power switching device so as to improve its turn-off characteristics).

Although the turn-off side delay circuit 122 of the present embodiment has been described as having the configuration shown in FIG. 5, it may have any suitable configuration that allows the circuit to delay a gate drive signal for a predetermined period of time and pass it to the second turn-off switch 118.

Third Embodiment

A third embodiment of the present invention provides a gate drive circuit that includes a simple, low cost circuit for changing the first turn-on voltage. This gate drive circuit differs from that shown in FIG. 1 in that the first turn-on voltage 18 is replaced by the turn-on side variable voltage circuit 300 shown in FIG. 16. That is, according to the present embodiment, the first turn-on voltage is supplied from this turn-on side variable voltage circuit 300 instead of the first turn-on voltage source 18. The output terminal OUTPUT of the turn-on side variable voltage circuit 300 is connected to the first turn-on wiring 40. The turn-on side variable voltage circuit 300 supplies the first turn-on voltage (also denoted by Vout herein), as described above. It should be noted that the configuration and operation of the gate drive circuit of the present embodiment are similar to those of the gate drive circuit of the first embodiment except that the first turn-on voltage is supplied from the turn-on side variable voltage circuit 300.

The turn-on side variable voltage circuit 300 will now be described with reference to FIG. 16. In this circuit, a voltage source VCC is connected to the collector of a transistor switch Q6 and to a resistance R which is connected to a zener diode D1. Zener diodes D1 to D6 are connected in series to one another in that order, with the other end of the zener diode D6 being connected to a ground terminal. The zener diodes D1 to D6 are used to supply a voltage to the base of the transistor switch Q6. The emitter of the transistor switch Q6 is connected to the output terminal OUTPUT.

Terminals are connected to these series-connected zener diodes D1 to D6, as shown in FIG. 16. More specifically, a terminal 302 is connected to one end of the zener diode D1, a terminal 304 is connected to the junction between the zener diodes D1 and D2, a terminal 306 is connected to the junction between the zener diodes D2 and D3, and so on. The terminals 302 and 304 are used to cause a predetermined constant current to flow through the diode D1 by means of a zener zapping technique so that its anode and cathode are substantially electrically shorted together. The other pairs of terminals are also used to zap their respective zener diodes in the same manner as described above.

The voltage Vout on the output terminal OUTPUT of the turn-on side variable voltage circuit 300 (having the configuration described above) is represented by Equation 1 below.

$$V_{out} = V_{Z1} + V_{Z2} + V_{Z3} + V_{Z4} + V_{Z5} + V_{Z6} - V_{BE,tm}$$
[Equation 1]

where VZ1 to VZ6 denote the zener voltages of the zener diodes D1 to D6, respectively, and VBE denotes the base-emitter voltage of the transistor switch Q6. When the anode and cathode of the zener diode 1 are substantially electrically shorted together by a zener zapping technique as described above, the zener diode 1 has a low resistance R1, as shown in FIG. 17. In this case, the voltage Vout on the output terminal OUTPUT of the turn-on side variable voltage circuit 300 is represented by Equation 2 below.

$$V_{out} = V_{Z2} + V_{Z3} + V_{Z4} + V_{Z5} + V_{Z6} - V_{BE}$$
[Equation 2]

When the zener diode D1 is zapped so as to have a low resistance, the output voltage Vout of the turn-on side variable voltage circuit 300 is reduced by an amount equal to the zener voltage of the zener diode D1. That is, the output voltage Vout of the turn-on side variable voltage circuit 300 can be varied in a stepwise manner by zapping a selected one or ones of the zener diodes D1 to D6. This means that the first turn-on voltage can be changed even after completion of the manufacture of the gate drive circuit.

Generally, the time rate of change of the voltage applied to the gate of a power switching device (dV/dt), which corresponds to the turn-on speed of the device, is controlled by the gate resistance connected to the gate. It should be noted that it may become necessary to change the turn-on speed of the power switching device from the initial value depending on its threshold voltage. A conventional method for doing this is to replace the gate resistance with a more suitable one. Another method is to connect a plurality of parallel-connected resistances to the gate in the manufacture of the device and switch between these gate resistances as necessary. However, these methods are disadvantageous in that they require manual work resulting in increased cost. Further, the above method of switching between a plurality of parallel-connected gate resistances requires a plurality of gate resistances (which must have a high power rating) and a plurality of switch circuits and hence requires increased mounting space, resulting in increased cost.

Further, in the case of the gate drive circuit of the first embodiment (described above), the first turn-on voltage must be higher than the threshold voltage of the power switching device and be such that, with this voltage applied to its gate, the power switching device exhibits high resistance to short circuiting. However, each power switching device manufactured varies in its threshold voltage from other power switching devices of the same type due to process variations. In order to accommodate such variations, it is desirable that the first turn-on voltage of the gate drive circuit can be separately set for each power switching device manufactured.

The gate drive circuit of the present embodiment is adapted to allow one to easily vary its first turn-on voltage at low cost. Specifically, the first turn-on voltage Vout of the circuit can be readily changed by using the turn-on side variable voltage circuit 300. Therefore, the first turn-on voltage of the gate drive circuit can be separately set for each power switching device manufactured, thus allowing an improvement in the characteristics and yield of the device. Further, the first turn-on voltage of the gate drive circuit of the present embodiment can be accurately set to the desired value so that the power switching circuit exhibits high resistance to short circuiting.

Although in the present embodiment the turn-on side variable voltage circuit 300 (a gate voltage source) is incorporated in the gate drive circuit shown in FIG. 1, in other embodiment it may be incorporated in other gate drive circuits (such as those described above) adapted to apply a voltage to the gate of a power switching device through a resistance. This allows these gate drive circuits to adjust the turn-on speed (dV/dt) of the power switching device to the desired value and thereby eliminates the need to replace the gate resistance or employ a plurality of parallel-connected gate resistances and switch between these gate resistances as described above, resulting in reduced cost.

FIG. 18 is a table showing characteristics of a power switching device driven by the gate drive circuit of the present embodiment when the first turn-on voltage VD is 11.5 V, 12.5 V, and 13.5 V. In FIG. 18, symbol tc represents the period between the time when the current of the power switching device has fallen to 10% of its steady state value and the time when the collector-emitter voltage VCE has decreased to 10% of its maximum value. That is, tc is a parameter indicating a power loss. Further, tr represents the time required for the collector-emitter current ICE of the power switching device to increase from 10% to 90% of its steady state value, and trr represents the reverse recovery current.

By changing the first turn-on voltage VD of the gate drive circuit, it is possible to change the power loss, the recovery current, and the radiated noise level of the power switching device, as indicated by FIG. 18. Therefore, in the present embodiment, the turn-on side variable voltage circuit 300 may be adjusted so that the power switching device exhibits the desired characteristics.

Although the turn-on side variable voltage circuit 300 has been described as including six zener diodes, it may include any suitable number of zener diodes. Further, the voltage source VCC may be shared by other circuits. Further, the switch Q6 (for receiving the output voltages of the zener diodes and outputting the output voltage Vout) may be replaced by another suitable switch while still retaining the advantages of the present embodiment.

Although in the present embodiment the turn-on side variable voltage circuit 300 is used to generate the first turn-on voltage, in other embodiments the circuit may serve other purposes. For example, the turn-on side variable voltage circuit 300 may be used in the gate drive circuit of the first embodiment to generate the second turn-on voltage VC. This allows the steady state loss in the power switching device to be optimized.

Fourth Embodiment

A fourth embodiment of the present invention provides a gate drive circuit that includes a simple, low cost circuit for changing the first turn-off voltage. This gate drive circuit differs from that shown in FIG. 11 in that the first turn-off voltage source 108 is replaced by the turn-off side variable voltage circuit 400 shown in FIG. 19. That is, according to the present embodiment, the first turn-off voltage is supplied from this turn-off side variable voltage circuit 400 instead of the first turn-off voltage source 108. The output terminal OUTPUT of the turn-off side variable voltage circuit 400 is connected to the first turn-off wiring 116. The turn-off side variable voltage circuit 400 supplies the first turn-off voltage V4 (also denoted by Vout herein), as described above. It should be noted that the configuration and operation of the gate drive circuit of the present embodiment are similar to those of the gate drive circuit of the second embodiment except that the first turn-off voltage is supplied from the turn-off side variable voltage circuit 400.

The following description of the turn-off side variable voltage circuit 400 of the present embodiment will be directed to the differences from the turn-on side variable voltage circuit 300 since they are similar in configuration. In the turn-off side variable voltage circuit 400, a voltage source VCC is connected to the collector of a transistor switch Q7, and the base of the transistor switch Q7 is connected to a zener diode D1. Zener diodes D1 to D6 are connected in series to one another in that order, with the other end of the zener diode D6 being connected to a ground terminal. Terminals are connected to these series-connected zener diodes D1 to D6, as shown in FIG. 19. More specifically, a terminal 402 is connected to one end of the zener diode D1, a terminal 404 is connected to the junction between the zener diodes D1 and D2, a terminal 406 is connected to the junction between the zener diodes D2 and D3, and so on. With this arrangement, each zener diode can be zapped so as to have a low resistance, as described in connection with the third embodiment. Therefore, the output voltage Vout of the turn-off side variable voltage circuit 400 can be varied in a stepwise manner by zapping a selected one or ones of the zener diodes D1 to D6. This means that the first turn-off voltage V4 can be changed even after completion of the manufacture of the gate drive circuit.

Figure 20:
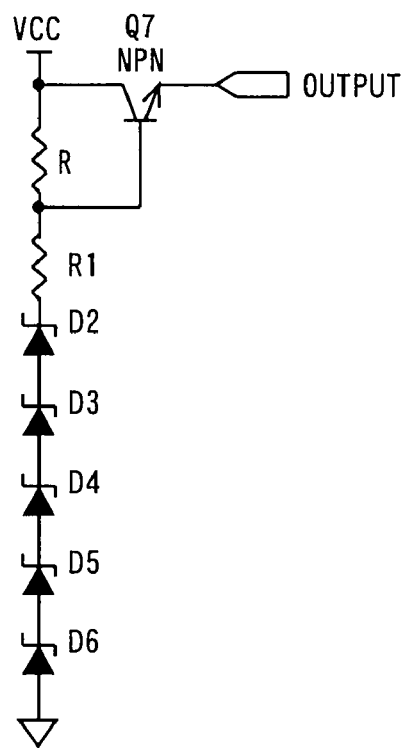
FIG. 20 shows the circuit zener diode 1 is substantially electrically shorted.

The output terminal OUTPUT connected to the emitter of the transistor switch Q7 outputs the first turn-off voltage Vout to the first turn-off power supply circuit. The first turn-off voltage Vout is represented by Equation 1 above when the turn-off side variable voltage circuit 400 is configured as shown in FIG. 19. On the other hand, when the turn-off side variable voltage circuit 400 has the configuration shown in FIG. 20 (i.e., when the zener diode D1 is zapped so as to have a low resistance), the voltage Vout is represented by Equation 2 above.

In the case of an arm including, for example, two power switching devices (which constitute an upper arm portion and a lower arm portion, respectively), these power switching devices are generally operated in such a way that there is a period (or a dead time) during which both devices are turned off in order to prevent a short circuit in the arm (i.e., simultaneous conduction of both arm portions or power switching devices). Increasing the dead time enhances operating reliability but may reduce the efficiency of the device including the arm, for example, an inverter. That is, it is preferable to reduce the dead time as much as possible while preventing a short circuit in the arm. However, generally, each power switching device varies in its threshold voltage and temperature characteristics from other power switching devices of the same type due to process variations, which results in variation in its turn-off characteristics such as the delay time. In order to accommodate such variation in the turn-off characteristics, it is necessary to increase the dead time. However, this results in a reduction in the operating efficiency.

The present embodiment provides a solution to this problem. According to the present embodiment, the turn-off side variable voltage circuit 400 can be adjusted to set the first turn-off voltage to an optimum value for each power switching device manufactured. This permits the turn-off side delay circuit 122 of the gate drive circuit for each power switching device in the arm to be set to produce substantially the same delay time. Further, the turn-off characteristics of these power switching devices can be equalized to reduce the dead time.

Although the turn-off side variable voltage circuit 400 has been described as including six zener diodes, it may include any suitable number of zener diodes. Further, the voltage source VCC may be shared by other circuits. Further, the switch Q7 (for receiving the output voltages of the zener diodes and outputting the output voltage Vout) may be replaced by another suitable switch while still retaining the advantages of the present embodiment.

Fifth Embodiment

A fifth embodiment of the present invention provides a gate drive circuit which can drive a power switching device in such a way as to vary the turn-on speed of the device according to its temperature. This gate drive circuit differs from that shown in FIG. 1 in that the first turn-on voltage source 18 is replaced by a switching delay circuit 500. That is, according to the present embodiment, the first turn-on voltage (also denoted by Vdelay herein) is supplied from the switching delay circuit 500 to the first turn-on side power supply circuit. It should be noted that the configuration and operation of the gate drive circuit of the present embodiment are similar to those of the gate drive circuit of the first embodiment except that the first turn-on voltage is supplied from the switching delay circuit 500.

Figure 21:
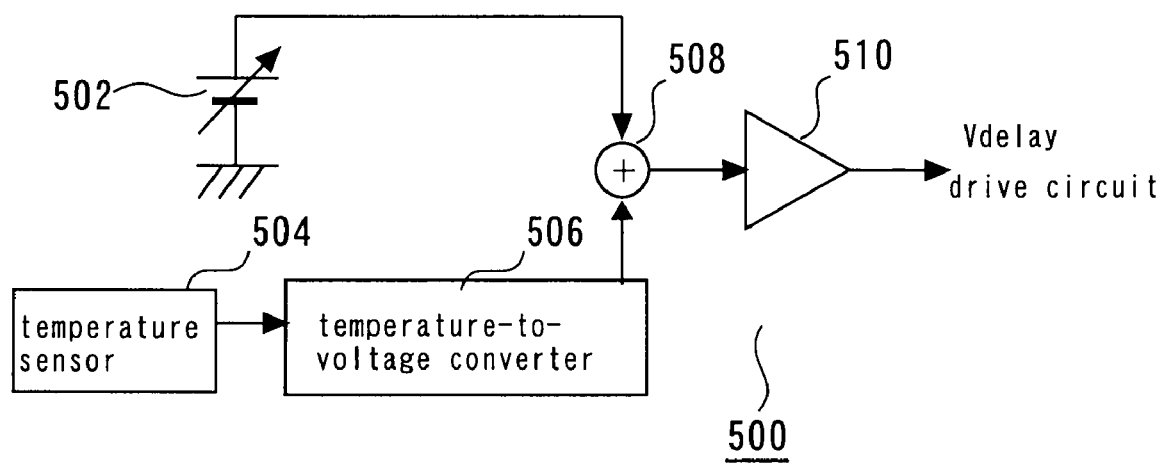
FIG. 21 is a diagram illustrating the configuration of the switching delay circuit of the fifth and sixth embodiment.

FIG. 21 is a diagram illustrating the configuration of the switching delay circuit 500 of the present embodiment for supplying the first turn-on voltage. The switching delay circuit 500 includes a variable voltage source 502 which is similar to the turn-on side variable voltage circuit 300 shown in FIG. 16. This allows the first turn-on voltage to be adjusted to the desired value even after completion of the manufacture of the gate drive circuit.

The switching delay circuit 500 also includes a temperature sensor 504, a temperature-to-voltage converter 506, an adder circuit 508, and a power amplifier 510. The temperature sensor 504 is used to detect the temperature of the power switching device. The temperature-to-voltage converter 506 is connected to the temperature sensor 504 to generate a voltage in response to the temperature information received from the temperature sensor 504. More specifically, the temperature-to-voltage converter 506 outputs a voltage such that the turn-on speed of the power switching device decreases with increasing temperature of the device. That is, the output voltage of the temperature-to-voltage converter 506 decreases with increasing temperature of the power switching device. The output of the temperature-to-voltage converter 506 and the output of the variable voltage source 502 are connected to the input of the adder circuit 508. Further, the output of the adder circuit 508 is connected to the input of the power amplifier 510, and the output of the power amplifier 510 is connected to the first turn-on wiring 40 so that the output voltage of the power amplifier 510 is supplied to the first turn-on side power supply circuit as the first turn-on voltage.

The function and operation of the switching delay circuit 500 will now be described with reference to FIG. 10. In the H-bridge circuit shown in FIG. 10, when the switch Q4 is on, a freewheel current flows as indicated by the arrow in the figure. (It should be noted that a freewheel current flows when the energy stored in a load is released.) Specifically, the freewheel current flows through the diode D2, the load, and the switch Q4. Then when the switch Q1 is turned on, a current flows through the voltage source V2, the switch Q1, the load, and the switch Q4. As a result, the forward current through the diode D2 gradually decreases to zero and then a reverse recovery current flows from the cathode to anode of the diode D2. (This current passes through the voltage source V2, the switch Q1, and the diode D2.)

The reverse recovery current of the diode D2 depends on its temperature (i.e., the temperature of the whole device including the diode). More specifically, the maximum value of the reverse recovery current tends to increase with the device temperature. Further, since the time rate of change of the reverse recovery current (dI/dt) is high, a significant electromotive force may be induced in the parasitic inductance of the path through which the reverse recovery current flows, resulting in emission of noise. Generally, the time rate of change of the reverse recovery current increases with the maximum value of the current which in turn increases with the device temperature, as described above, resulting in an increase in the noise level.

According to the present embodiment, the temperature-to-voltage converter 506 in the switching delay circuit 500 outputs a voltage such that the turn-on speed of the power switching device decreases with increasing temperature of the device. Since reducing the turn-on speed of the device reduces the time rate of change of the reverse recovery current of the diode (dI/dt), the gate drive circuit of the present embodiment can reduce the noise generated from the power switching device when the device is turned on at high temperatures. Further, since the switching delay circuit 500 of the present embodiment includes the variable voltage source 502, the first turn-on voltage can be separately set for each power switching device manufactured to optimize its switching characteristics while reducing the time rate of change of the reverse recovery current at high device temperatures.

Although the variable voltage source 502 has been described as having the same configuration as the turn-on side variable voltage circuit 300 shown in FIG. 16, it may be a constant voltage source. This still allows the turn-on speed of the power switching device to be optimized with respect to the device temperature (which is the primary advantage of the present embodiment). Further, the adder circuit 508 and the power amplifier 510 may have different configurations than those described above.

Sixth Embodiment

A sixth embodiment of the present invention provides a gate drive circuit which can drive a power switching device in such a way as to vary the turn-off speed of the device according to its temperature. This gate drive circuit differs from that shown in FIG. 11 in that the first turn-off voltage source 108 is replaced by the switching delay circuit 500 shown in FIG. 21. That is, according to the present embodiment, the first turn-off voltage (also denoted by Vdelay herein) is supplied from the switching delay circuit 500 to the first turn-off side power supply circuit. It should be noted that the configuration and operation of the gate drive circuit of the present embodiment are similar to those of the gate drive circuit of the second embodiment except that the first turn-off voltage is supplied from the switching delay circuit 500.

The configuration of the switching delay circuit 500 shown in FIG. 21 was already described in connection with the fifth embodiment. The advantages of the present embodiment will now be described. The gate drive circuit of the fourth embodiment is disadvantageous in that the delay time of the power switching device driven by this circuit varies with the temperature of the device, making it necessary to increase the dead time of the arm in which the power switching device is connected. On the other hand, the gate drive circuit of the present embodiment solves this problem by including the variable voltage source 502. Further, the turn-off delay time of each power switching device depends on its temperature, as described above. However, in the case of the gate drive circuit of the present embodiment, the first turn-off voltage supplied from the switching delay circuit 500 can be adjusted to accommodate the variations in the turn-off delay time of each power switching device due to variations in its temperature, as well as to accommodate process variations.

Seventh Embodiment

Figure 22:
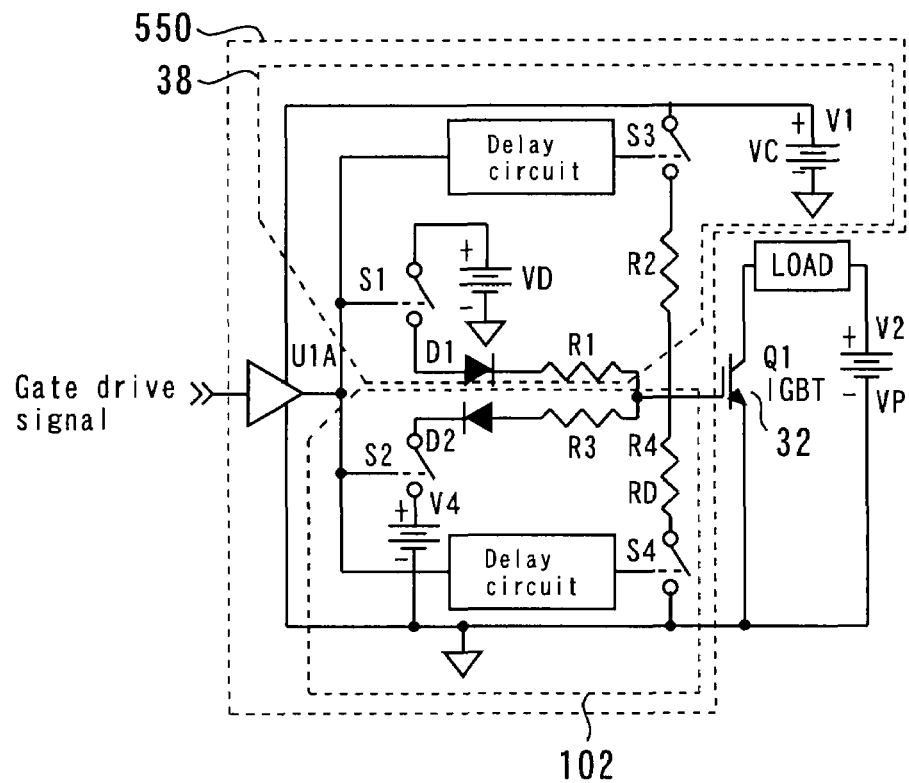
FIG. 22 shows the configuration of the gate drive circuit of seventh embodiment.

A seventh embodiment of the present invention provides a gate drive circuit which can drive a power switching device in such a way as to optimize both the turn-on and turn-off characteristics of the device. FIG. 22 shows the configuration of this gate drive circuit (550). Referring to FIG. 22, the gate drive circuit 550 includes a turn-on side circuit 38 and a turn-off side circuit 102. The turn-on side circuit 38 of the present embodiment has the same configuration and operation as the turn-on side circuit 38 of the first embodiment. Further, the turn-off side circuit 102 of the present embodiment has the same configuration and operation as the turn-off side circuit 102 of the second embodiment.

The gate drive circuit 550 of the present embodiment turns on the power switching device 32 (connected thereto) in such a way that the device exhibits sufficient resistance to short circuiting and reduced loss (as in the first embodiment). Further, this circuit turns off the power switching device 32 in such a way that the device exhibits sufficient resistance to short circuiting and quickly transitions to an off state resulting in reduced loss (as in the second embodiment). Thus, the gate drive circuit of the present embodiment can optimize both the turn-on and turn-off characteristics of the power switching device.

Eighth Embodiment

Figure 23:
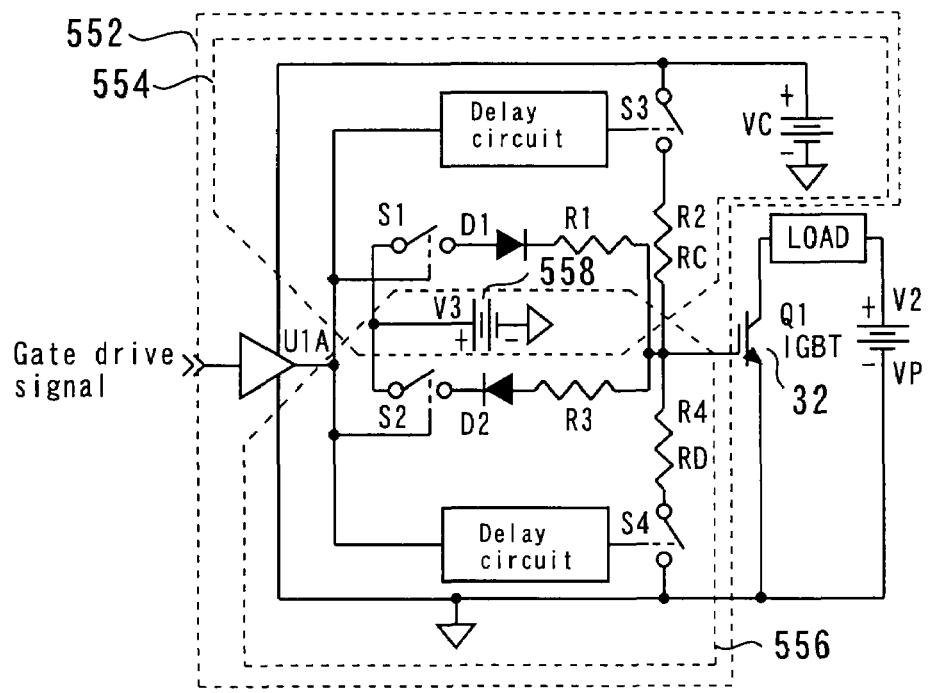
FIG. 23 shows the configuration of the gate drive circuit of eighth embodiment.

An eighth embodiment of the present invention provides a gate drive circuit which can drive a power switching device in such a way as to optimize both the turn-on and turn-off characteristics of the device by using fewer voltage sources than used in the gate drive circuit of the seventh embodiment. This gate drive circuit (552) will be described with reference to FIG. 23. Referring to FIG. 23, the gate drive circuit 552 includes a turn-on side circuit 554 and a turn-off side circuit 556 for turning on and turning off, respectively, a power switching device 32.

The gate drive circuit of the present embodiment differs from that shown in FIG. 22 in that the first turn-on voltage and the first turn-off voltage are supplied from the same voltage source. Specifically, in the gate drive circuit of FIG. 22, the first turn-on voltage VD is supplied from the first turn-on voltage source and the first turn-off voltage V4 is supplied from the first turn-off voltage source. In the gate drive circuit of the present embodiment shown in FIG. 23, on the other hand, the first turn-on voltage and the first turn-off voltage are the same voltage (denoted by V3) and are supplied from a common voltage source 558. In other words, the first turn-on voltage source also serves as the first turn-off voltage source. In still other words, the first turn-off voltage source also serves as the first turn-on voltage source.

Whereas the gate drive circuit of the seventh embodiment includes a separate first turn-on voltage source and a separate first turn-off voltage source, the gate drive circuit of the present embodiment includes a common voltage source that serves as both of these voltage sources, instead, resulting in simplification and reduction of the size of the circuit.

Although the common voltage source 558 for supplying the voltage V3 has been described as being a constant voltage source, it may be a variable voltage source such as the turn-on side variable voltage circuit 300 shown in FIG. 16, with the same effect. The use of such a voltage source allows the gate drive circuit to optimize the switching characteristics of each power switching device manufactured.

Further, the common voltage source 558 may be a switching delay circuit such as the switching delay circuit 500 shown in FIG. 21, with the same effect. The use of such a circuit (or voltage source) allows the gate drive circuit to vary the switching speed of the power switching circuit according to its temperature and thereby reduce the time rate of change of the reverse recovery current, resulting in reduced noise.

Ninth Embodiment

Figure 24:
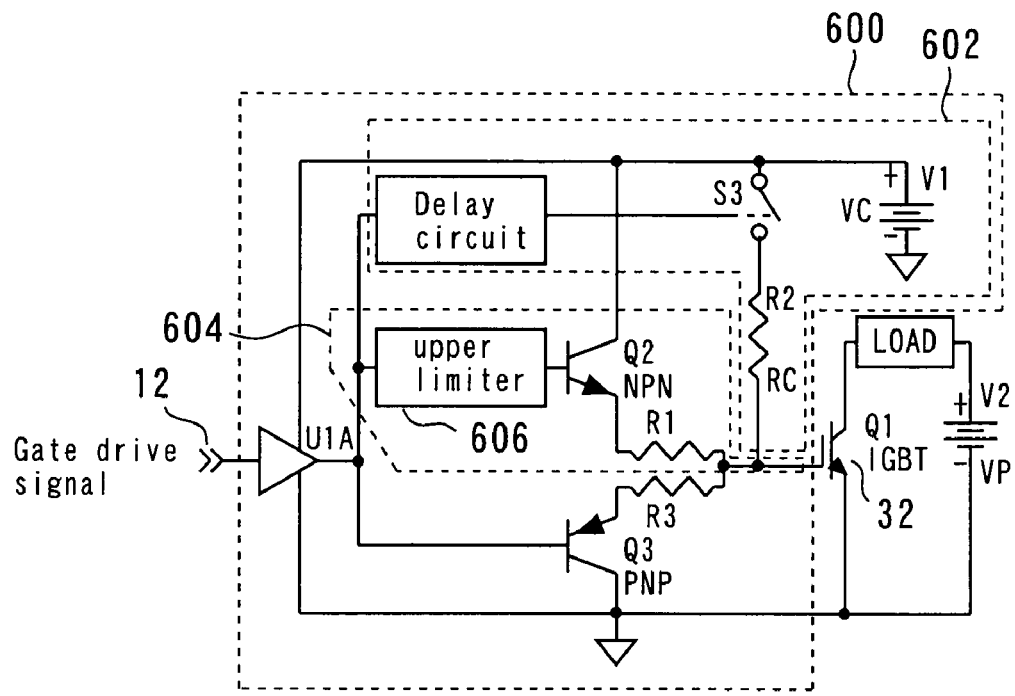
FIG. 24 shows the configuration of the gate drive circuit of ninth embodiment.

A ninth embodiment of the present invention provides a simple gate drive circuit which can drive a power switching device in such a way as to optimize its turn-on characteristics. FIG. 24 shows the configuration of this gate drive circuit (600). Referring to FIG. 24, the gate drive circuit 600 includes a turn-on operation circuit for turning on a power switching device 32. The turn-on operation circuit includes a first turn-on circuit 602 and a second turn-on circuit 604. The first turn-on circuit 602 has the same configuration as the second turn-on side power supply circuit 52 of the first embodiment.

The second turn-on circuit 604, on the other hand, includes an upper limiter (or maximum voltage limiter) 606. This limiter receives a gate drive signal from a gate drive signal transmission unit 12 and, if the value (or voltage level) of the gate drive signal is higher than a predetermined value, the limiter reduces it and passes the resulting signal to the base of a bipolar transistor Q2 of NPN type. The collector of the bipolar transistor Q2 is connected to a voltage source V1, and its emitter is connected to a resistance R1 that is connected to the gate of the power switching device 32. Thus, the second turn-on circuit 604 of the present embodiment includes the upper limiter 606, the bipolar transistor Q2, and the resistance R1.

Figure 25:
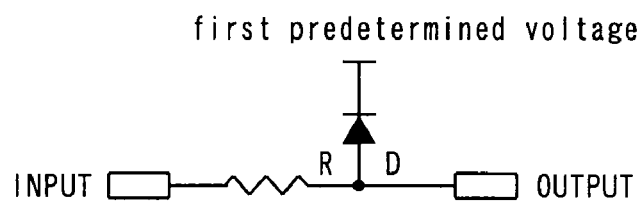
FIG. 25 shows the configuration of the upper limiter.

The configuration of the upper limiter 606 will be described in detail with reference to FIG. 25. In FIG. 25, symbol INPUT denotes a terminal for receiving a gate drive signal. This terminal is connected to the gate drive signal transmission unit 12 by electrical wiring. Symbol OUTPUT denotes a terminal connected to the base of the bipolar transistor Q2. The input terminal INPUT is connected to the output terminal OUTPUT through a resistance R. Further, the anode of a diode D is connected to the junction between the resistance R and the output terminal OUTPUT, and a first predetermined voltage is applied to the cathode of the diode D. The first predetermined voltage is equal to the first turn-on voltage VD described in connection with the first embodiment. It should be noted that the resistance R serves to protect the diode D.

The upper limiter 606 receives a voltage on its input terminal INPUT and, if this voltage is higher than the first predetermined voltage, the upper limiter 606 outputs the first predetermined voltage from its output terminal OUTPUT. Such a circuit is generally referred to as a "clamping circuit."

The gate drive circuit 600 of the present embodiment also includes a turn-off operation circuit described below. Referring now to FIG. 24, this turn-off operation circuit includes a PNP bipolar transistor Q3 whose gate receives a gate drive signal from the gate drive signal transmission unit 12. The collector of the transistor Q3 is connected to ground potential. The turn-off operation circuit further includes a resistance R3 connected between the emitter of the transistor Q3 and the gate of the power switching device 32. Thus, the turn-off operation circuit of the present embodiment includes the bipolar transistor Q3 and the resistance R3.

This completes the description of the turn-on operation circuit and the turn-off operation circuit of the gate drive circuit 600 of the present embodiment. In the gate drive circuit 600, the NPN bipolar transistor Q2 and the PNP bipolar transistor Q3 are connected in an emitter follower configuration, as described above.

Thus, in the gate drive circuit 600, the voltage applied to the base of the bipolar transistor switch Q2 is limited by the upper limiter 606 so as not to exceed the first predetermined voltage, thereby eliminating the need for the turn-on voltage source 18 described in connection with first embodiment. Further, this gate drive circuit does not require the diode 20 described in connection with the first embodiment (for the reason described later). This means that the gate drive circuit 600 has a simpler configuration than the gate drive circuit of the first embodiment but still can drive a power switching device in such a way that the device exhibits increased resistance to short circuiting and reduced loss.

In the present embodiment, since the bipolar transistor Q2 is of NPN type, application of a reverse voltage to the transistor Q2 is prevented when both the switch S3 and the transistor Q2 are turned on, as in the case of the diode 20 in the first embodiment.

Figure 26:
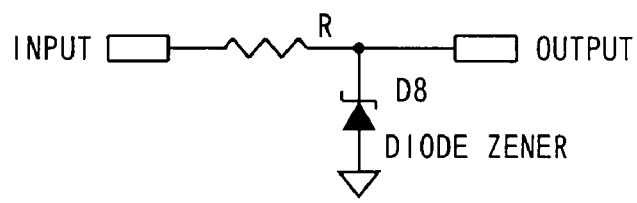
FIG. 26 shows configuration of the upper limiter other than FIG. 25.

Although the upper limiter 606 of the present embodiment has been described as having the configuration shown in FIG. 25, the limiter may have any suitable configuration that allows it to deliver a voltage equal to or less than the first predetermined voltage to the output terminal OUTPUT. For example, the upper limiter may have the configuration shown in FIG. 26 while still retaining the advantages of the present embodiment. In this configuration, the voltage on the output terminal OUTPUT can be limited to be equal to or less than the zener voltage of a zener diode D8.

In the present embodiment, the voltage used by the upper limiter 606 to limit the voltage on the output terminal OUTPUT is the first predetermined voltage (a fixed voltage) supplied by some constant voltage source. In other embodiments, however, the voltage used by the upper limiter 606 may be varied using a suitable variable voltage circuit (or first predetermined value varying circuit). For example, the upper limiter 606 may use a voltage supplied from the turn-on side variable voltage circuit 300 shown in FIG. 16, which allows the gate drive circuit to accommodate variations in the threshold voltage of each power switching device manufactured.

Further, the voltage used by the upper limiter 606 to limit the voltage on the output terminal OUTPUT may be supplied from the switching delay circuit 500 shown in FIG. 21, which allows the gate drive circuit to vary the turn-on speed of the power switching device according to its temperature.

Tenth Embodiment

Figure 27:
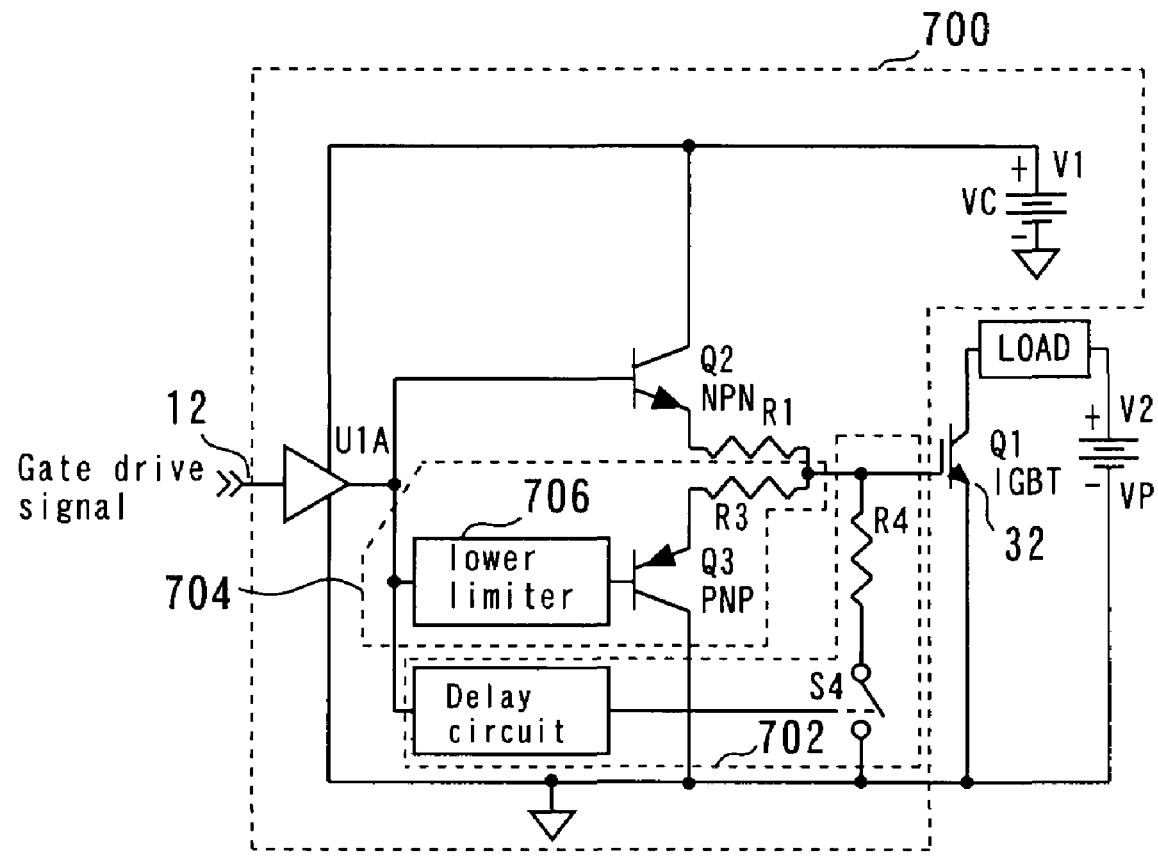
FIG. 27 shows the configuration of the gate drive circuit of tenth embodiment.

A tenth embodiment of the present invention provides a simple gate drive circuit which can drive a power switching device in such a way as to optimize its turn-off characteristics. FIG. 27 shows the configuration of this gate drive circuit (700). Referring to FIG. 27, the gate drive circuit 700 includes a turn-off operation circuit for turning off a power switching device 32. The turn-off operation circuit includes a first turn-off circuit 702 and a second turn-off circuit 704. The first turn-off circuit 702 has the same configuration as the second turn-off side circuit 106 of the second embodiment.

The second turn-off circuit 704, on the other hand, includes a lower limiter (or minimum voltage limiter) 706. This limiter receives a gate drive signal from a gate drive signal transmission unit 12 and, if the value (or voltage level) of the gate drive signal is lower than a predetermined value, the limiter increases it and passes the resulting signal to the base of a bipolar transistor Q3 of PNP type. The collector of the bipolar transistor Q3 is connected to a ground terminal, and its emitter is connected to a resistance R3 that is connected to the gate of the power switching device 32. Thus, the second turn-off circuit 704 of the present embodiment includes the lower limiter 706, the bipolar transistor Q3, and the resistance R3.

The lower limiter 706 will now be described in detail. This limiter has the circuit configuration shown in FIG. 28. Such a circuit is generally referred to as a "clamping circuit." In FIG. 28, symbol INPUT denotes a terminal for receiving a gate drive signal. This terminal is connected to the gate drive signal transmission unit 12 by electrical wiring. Symbol OUTPUT denotes a terminal connected to the base of the bipolar transistor Q3. The input terminal INPUT is connected to the output terminal OUTPUT through a resistance R. Further, the cathode of a diode D is connected to the junction between the resistance R and the output terminal OUTPUT, and a second predetermined voltage is applied to the anode of the diode D. The second predetermined voltage is substantially equal to the first turn-off voltage V4 described in connection with the second embodiment. It should be noted that the resistance R serves to protect the diode D.

The gate drive circuit 700 of the present embodiment also includes a turn-on operation circuit described below. This turn-on operation circuit includes an NPN bipolar transistor Q2 whose base receives a gate drive signal from the gate drive signal transmission unit 12. The collector of the transistor Q2 is connected to a voltage source V1. The turn-on operation circuit further includes a resistance R1 connected between the emitter of the transistor Q2 and the gate of the power switching device 32. Thus, the turn-on operation circuit of the present embodiment includes the bipolar transistor Q2 and the resistance R1.

This completes the description of the turn-on operation circuit and the turn-off operation circuit of the gate drive circuit 700 of the present embodiment. In the gate drive circuit 700, the NPN bipolar transistor Q2 and the PNP bipolar transistor Q3 are connected in an emitter follower configuration, as described above.

Thus, in the gate drive circuit 700, the voltage applied to the base of the bipolar transistor Q3 is limited by the lower limiter 706 so that it is substantially equal to the first turn-off voltage, thereby eliminating the need for the turn-off voltage source 108 described in connection with the second embodiment. Further, this gate drive circuit does not require the diode 112 described in connection with the second embodiment. This means that the gate drive circuit 700 has a simpler configuration than the gate drive circuit of the second embodiment and still provides the advantages of the second embodiment.

In the present embodiment, since the bipolar transistor Q3 is of PNP type, application of a reverse voltage to the transistor Q3 is prevented when both the switch S3 and the transistor Q3 are turned on, as in the case of the diode 112 in the second embodiment.

Figure 28:
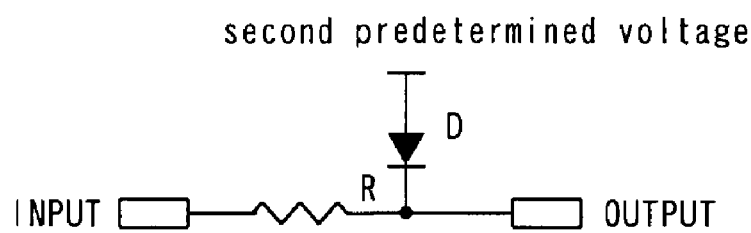
FIG. 28 shows the circuit configuration of lower limiter.
Figure 29:
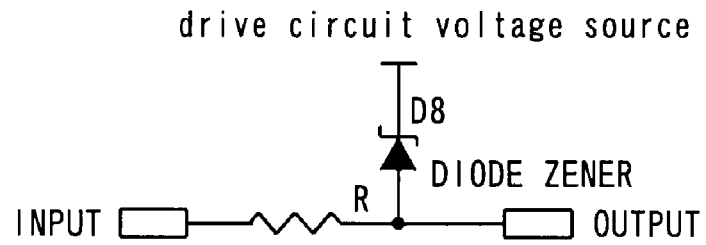
FIG. 29 shows the circuit configuration of lower limiter other than FIG. 28.

Although the lower limiter 706 of the present embodiment has been described as having the configuration shown in FIG. 28, the limiter may have any suitable configuration that allows it to deliver a voltage substantially equal to the first turn-off voltage to the output terminal OUTPUT. For example, the lower limiter 706 may have the configuration shown in FIG. 29. In this configuration, the voltage on the output terminal OUTPUT is equal to the voltage from the drive circuit voltage source minus the zener voltage of a zener diode D8 (see FIG. 29).

In the present embodiment, the voltage used by the lower limiter 706 to limit the voltage on the output terminal OUTPUT is the second predetermined voltage (a fixed voltage) supplied from some constant voltage source. In other embodiments, however, the voltage used by the lower limiter 706 may be varied using a suitable variable voltage circuit (or second predetermined value varying circuit). For example, the lower limiter 706 may use a voltage supplied from the turn-on side variable voltage circuit 300 shown in FIG. 16, which allows the gate drive circuit to accommodate variations in the threshold voltage of each power switching device manufactured.

Further, the voltage used by the lower limiter 706 to limit the voltage on the output terminal OUTPUT may be supplied from the switching delay circuit 500 shown in FIG. 21, which allows the gate drive circuit to vary the turn-off speed of the power switching device according to its temperature.

Eleventh Embodiment

Figure 30:
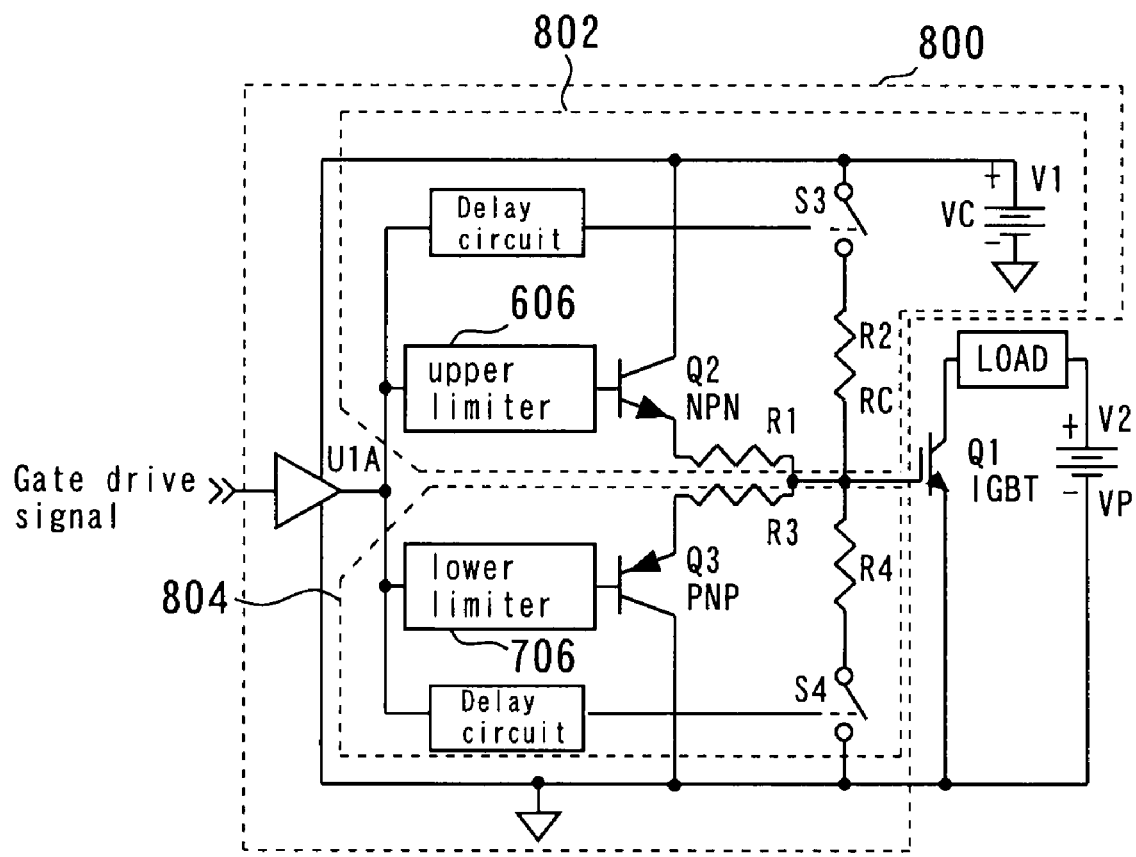
FIG. 30 shows the configuration of the gate drive circuit of eleventh embodiment.

An eleventh embodiment of the present invention provides a simple gate drive circuit which can drive a power switching device in such a way as to optimize both the turn-on and turn-off characteristics of the device. FIG. 30 shows the configuration of this gate drive circuit (800). Referring to FIG. 30, the gate drive circuit 800 includes a turn-on operation circuit 802 for turning on a power switching device 32. This turn-on operation circuit has the same configuration as the turn-on operation circuit of the ninth embodiment.

The gate drive circuit 800 of the present embodiment also includes a turn-off operation circuit 804 which has the same configuration as the turn-off operation circuit of the tenth embodiment.

The gate drive circuit 800 provides the advantages of the ninth embodiment when turning on the power switching device. Specifically, the first turn-on voltage is limited by the upper limiter 606 so as not to exceed a predetermined value. This allows the gate drive circuit to turn on the power switching device in such a way that the device exhibits sufficient resistance to short circuiting, eliminating the need for the first turn-on voltage source and the diode described in connection with the first embodiment. Further, the gate drive circuit 800 provides the advantages of the tenth embodiment when turning off the power switching device. Specifically, the first turn-off voltage is limited by the lower limiter 706 so that it is substantially equal to the first turn-off voltage in the second embodiment. This allows the gate drive circuit to turn off the power switching device in such a way that the device exhibits sufficient resistance to short circuiting.

It will be understood that both the upper limiter 606 and the lower limiter 706 may have various configurations, as described in connection with the ninth and tenth embodiments.

Thus, the present invention enables a power switching device to be driven in such a way that the device exhibits sufficient resistance to short circuiting while preventing an increase in its steady state loss, as well as allowing the switching characteristics of the device to be arbitrarily set.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-236671, filed on Sep. 12, 2007 including specification, claims, drawings and summary, on which the Convention priority of the present application is based, are incorporated herein by reference in its entirety.

What is claimed is:

1. A gate drive circuit comprising a turn-on side circuit for turning on a gate of a power switching device, said turn-on side circuit including a first turn-on side power supply circuit and a second turn-on side power supply circuit, said first turn-on side power supply circuit including:

a first turn-on voltage source for supplying a first turn-on voltage;

first turn-on wiring connected between said first turn-on voltage source and said gate of said power switching device; and a first turn-on switch connected in said first turn-on wiring and controlled by a gate drive signal; and said second turn-on side power supply circuit including:

a second turn-on voltage source for supplying a second turn-on voltage applied to said gate of said power switching device to set said power switching device in a steady (on) state;

second turn-on wiring connected between said second turn-on voltage source and said gate of said power switching device;

a second turn-on switch connected in said second turn-on wiring; and a turn-on side delay circuit for delaying said gate drive signal and passing it to said second turn-on switch;

wherein said first and second turn-on voltages are higher than a threshold voltage of said power switching device, and said first turn-on voltage is lower than said second turn-on voltage.

2. A gate drive circuit as claimed in claim 1, further comprising a turn-on side variable voltage circuit for varying said first turn-on voltage.

3. A gate drive circuit as claimed in claim 2, wherein said turn-on side variable voltage circuit includes:
   a plurality of zener diodes for supplying said first turn-on voltage; and
   terminals each connected to a respective end of a respective one of said zener diodes.

4. A gate drive circuit as claimed in claim 1, further comprising a turn-off side circuit for turning off said gate of said power switching device, said turn-off side circuit including a first turn-off side power supply circuit and a second turn-off side circuit,
   said first turn-off side power supply circuit including:
      a first turn-off voltage source for supplying a first turn-off voltage;
      first turn-off wiring connected between said first turn-off voltage source and said gate of said power switching device; and
      a first turn-off switch connected in said first turn-off wiring and controlled by a gate drive signal;
   said second turn-off side circuit including:
      a ground terminal;
      second turn-off wiring connected between said ground terminal and said gate of said power switching device;
      a second turn-off switch connected in said second turn-off wiring; and
      a turn-off side delay circuit for delaying said gate drive signal and passing it to said second turn-off switch;
   wherein said first turn-off voltage is lower than a voltage applied to (said gate of) said power switching device to set said power switching device in a steady (on) state.

5. A gate drive circuit as claimed in claim 4, wherein a common voltage source serves as both said first turn-off voltage source and said first turn-on voltage source.

* * * * *